US006788393B2

(12) United States Patent
Inoue

(10) Patent No.: US 6,788,393 B2
(45) Date of Patent: Sep. 7, 2004

(54) STAGE UNIT AND EXPOSURE APPARATUS

(75) Inventor: Jiro Inoue, Kumagaya (JP)

(73) Assignee: Nikon Corporation, Tokyo (JP)

( * ) Notice: Subject to any disclaimer, the term of this patent is extended or adjusted under 35 U.S.C. 154(b) by 40 days.

(21) Appl. No.: 09/995,595

(22) Filed: Nov. 29, 2001

(65) Prior Publication Data

US 2002/0063856 A1 May 30, 2002

(30) Foreign Application Priority Data

Nov. 29, 2000 (JP) .......................................... 2000-362258
Nov. 22, 2001 (JP) .......................................... 2001-356904

(51) Int. Cl.$^7$ ......................... G03B 27/58; G03B 27/42; G01B 11/00
(52) U.S. Cl. ........................... 355/72; 355/53; 356/401
(58) Field of Search ............................ 355/72, 53, 59; 356/399, 400, 401, 503; 430/22; 250/548

(56) References Cited

U.S. PATENT DOCUMENTS

| 5,920,378 A | * | 7/1999 | Murakami et al. ............ 355/53 |
| RE36,730 E | | 6/2000 | Nishi | |
| 6,160,619 A | * | 12/2000 | Magome ...................... 356/503 |
| 2002/0003615 A1 | * | 1/2002 | Osakabe et al. .............. 355/53 |
| 2002/0037460 A1 | * | 3/2002 | Takahashi ..................... 430/22 |

FOREIGN PATENT DOCUMENTS

| EP | 0 951 054 | 10/1999 |
| JP | 61-236120 | 10/1986 |

* cited by examiner

*Primary Examiner*—Peter B. Kim
(74) *Attorney, Agent, or Firm*—Oblon, Spivak, McClelland, Maier & Neustadt, P.C.

(57) ABSTRACT

A plurality of fiducial mark plates, on which a plurality of fiducial marks are dispersedly arranged by each measurement sequence which uses the fiducial mark, are arranged on the periphery of a substrate holder on the substrate stage so as to make the positional relationship between the substrate holder constant. This allows the fiducial mark plates to be arranged on the substrate stage at a place where there is little space. In addition, the main controller performs various measurement sequences that include the detection operation to detect the positional information on each fiducial mark using the mark detection system. Accordingly, it becomes possible to downsize the substrate stage, which leads to a reduction in footprint, while maintaining the measurement functions.

11 Claims, 5 Drawing Sheets

STAGE UNIT AND EXPOSURE APPARATUS

BACKGROUND OF THE INVENTION

1. Field of the Invention

The present invention relates to a stage unit and an exposure apparatus. More particularly, it relates to an exposure apparatus that performs exposure on a substrate with an energy beam so as to form a predetermined pattern on the substrate and a stage unit that can be suitably applied to the exposure apparatus.

2. Description of the Related Art

Conventionally, in a lithographic process to manufacture devices such as a semiconductor device or a liquid crystal display device and the like, an exposure apparatus is used that transfers a pattern formed on a mask or a reticle (hereinafter generally referred to as a "reticle") onto a wafer or a glass plate (hereinafter generally referred to as a "wafer") via a projection optical system. In recent years, due to higher integration of the semiconductor device, the type of projection exposure apparatus that moves step by step such as the reduction projection exposure apparatus based on the step-and-repeat method (the so-called stepper) and the scanning type projection exposure apparatus, which is an improvement of the stepper, based on the step-and-scan method (the so-called scanning stepper) or the like has become mainstream.

The semiconductor device or the like is made by overlaying patterns in multiple layers, therefore, with the exposure apparatus such as the stepper the overlay of the pattern formed on the reticle onto the pattern already formed on the wafer needs to be highly accurate. This requires a precise measurement of the position on the wafer of the shot area where the pattern is formed, and for the precise measurement a method that uses a variety of position measurement sensors to measure the position of alignment marks arranged along each shot area is employed.

Furthermore, for this measurement, as a reference for measuring the positional relationship between the reticle, the projection lens, and the wafer a fiducial mark plate on which various types of fiducial marks are formed is arranged in the vicinity of the wafer on the wafer stage that holds the wafer.

Normally, one fiducial mark plate is arranged on the wafer stage, and by measuring the fiducial marks formed on the fiducial mark plate the relative distance between position measurement sensors is controlled as well as the orthogonal degree of the stage interferometer that measures the position of the stage and the conversion rate used to figure out the distance from the interference fringe count measured with the stage interferometer.

In the case, however, when measurements for these controls are performed using a single fiducial mark plate, the measurement accuracy may decrease since the span of the measurement distance is limited by the size of the fiducial mark plate.

Therefore, as a means of improving the measurement accuracy, the possibility of increasing the size of the fiducial mark plate can be considered, however, this may lead to a larger stage size. Especially, with the exposure apparatus recently gathering attention that comprises a plurality of substrate stages, since the stages require an extremely large driving range the footprint of the apparatus naturally has to increase, thus causing an inconvenience.

Furthermore, with the exposure apparatus comprising a plurality of substrate stages as is referred to above, in most cases the exposure apparatus comprises only one optical system for exposure, and in such a case there is a tendency of the exposure position and the alignment position being far apart so as to prevent interference between stages from occurring. This makes the optical axis of the interferometer measuring the position of the stage between the exposure position and the alignment position stray from the stage, nevertheless, even in such a case, the positional relationship of the substrate on the stage with respect to the optical system for exposure and the mask must be controlled with good accuracy.

SUMMARY OF THE INVENTION

The present invention has been made in consideration of the circumstances described above, and has as its first object to provide a stage unit that can be downsized while maintaining its measurement performance.

It is the second object of the present invention to provide an exposure apparatus which substrate stage can be downsized as well as the footprint of the apparatus reduced.

And, it is the third object of the present invention to provide an exposure apparatus which substrate stage can be downsized and the footprint of the apparatus reduced, and is also capable of controlling the position of the substrate with good accuracy at all times.

According to the first aspect of the present invention, there is provided a stage unit comprising: a substrate holding member which holds a substrate; and a substrate stage which moves two dimensionally with the substrate holding member mounted, and on which a plurality of fiducial marks are arranged dispersed by each measurement sequence which uses the fiducial marks with a positional relationship between each of said fiducial marks and the substrate holding member constant.

With this stage unit, a plurality of fiducial marks are arranged dispersed by each measurement sequence which uses the fiducial marks and the positional relationship between each of the fiducial marks and the substrate holding member is constant. Therefore, for example, the fiducial marks can be respectively arranged apart at a certain interval on the periphery of the substrate holding member. This makes it possible to sufficiently secure the interval (distance) between the fiducial marks, relax the limitations on the measurement span, and consequently, improve the measurement accuracy. In addition, the respective fiducial marks can be arranged on the substrate stage even when the space is small. Since the plurality of fiducial marks are arranged dispersed by each measurement sequence which uses the fiducial marks, the performance regarding measurement can be maintained. Accordingly, the stage can be downsized, maintaining its measurement performance.

In this case, the plurality of fiducial marks can be at least three fiducial marks respectively arranged in the vicinity of each vertex position of a polygon, which contains a center of the substrate holding member. In such a case, the center of the substrate holding member lies within the area of the polygon surrounded by the fiducial marks, therefore, in the case of obtaining the center of the substrate holding member based on the measurement results of the position of the fiducial marks, the central point corresponds, so to speak, to the interpolation point of the fiducial mark positions. Accordingly, by performing a predetermined calculation based on the positional information on the fiducial marks, the holding member coordinate system which origin is the center of the substrate holding member can be obtained with a sufficient level of reliability.

With the stage unit according to the present invention, the plurality of fiducial marks can include a first fiducial mark and a second fiducial mark, which are arranged on a straight line passing through a center of the substrate holding member on opposite sides with respect to the center. In such a case, since the first fiducial mark and the second fiducial mark are arranged on a straight line passing through the center of the substrate holding member on opposite sides with respect to the center, the interval between both fiducial marks can be around the diameter length of the substrate holding member, which relaxes the limitations on the measurement span, and consequently, the measurement accuracy can be improved. In addition, since the two fiducial marks are symmetric with respect to the center of the substrate holding member, it is possible, for example, to easily calculate the center coordinate and the rotational angle of the substrate holding member.

With the stage unit according to the present invention, each fiducial marks may be formed directly on the substrate stage, however, the stage unit may further comprise: a plurality of fiducial mark plates arranged on a periphery of the substrate holding member on the substrate stage, on which at least one of the fiducial marks is respectively formed.

According to the second aspect of the present invention, there is provided a first exposure apparatus which exposes a substrate with an energy beam and forms a predetermined pattern on the substrate, the exposure apparatus comprising: a substrate stage that moves two-dimensionally; a substrate holding member mounted on the substrate stage that holds the substrate; a plurality of fiducial mark plates on which a plurality of fiducial marks are dispersedly arranged by each measurement sequence which uses the fiducial mark plates, and are arranged on a periphery of the substrate holding member on the substrate stage with a positional relationship between each of said fiducial marks and the substrate holding member constant; a mark detection system which detects marks located on the substrate stage; and a control unit, which performs various types of measurement sequences respectively including a detection operation to detect at least one of the plurality of fiducial marks using the mark detection system.

With this exposure apparatus, a plurality of fiducial mark plates on which a plurality of fiducial marks are arranged by each measurement sequence which uses the fiducial mark plates on the periphery of the substrate holding member, and the positional relationship between each fiducial mark and the substrate holding member is constant. This allows the fiducial mark plates to be arranged on even a small space on the substrate stage. Furthermore, since the control unit performs various types of measurement sequences respectively, including the detection operation to detect at least one of the pluralities of fiducial marks, the performance related to measurement can be maintained. Accordingly, it becomes possible to downsize the substrate stage, and in turn, to reduce the footprint of the apparatus, while maintaining its measurement performance.

In this case, when the exposure apparatus further comprises: a position measurement unit that controls a position of the substrate stage based on an orthogonal coordinate system, the plurality of fiducial mark plates can include a first mark plate on which a plurality of fiducial marks are arranged along a first axis direction of the orthogonal axis, the first mark plate narrowly extending in the first axis direction, and a second mark plate on which a plurality of fiducial marks are arranged along a second axis direction orthogonal to the first axis, the second mark plate narrowly extending in the second axis direction.

In this case, when the exposure apparatus further comprises: a mask stage that holds a mask on which the pattern is formed; a drive unit which synchronously moves the mask stage and the substrate stage along the second axis direction; and a pair of mark detection systems for masks that measure at least one pair of mask marks formed on both sides of the pattern on the mask in the first axis direction, a length of the first mark plate in the first axis direction can almost correspond to a distance between the pair of mask marks, and a length of the first mark plate in the second axis direction can be slightly longer than a length required to form the fiducial mark. In such a case, it becomes possible to form a pair of fiducial marks that can be measured at the same time with the pair of mask marks detected with the pair of mark detection systems on the first mark plate.

In addition, with the first exposure apparatus according to the present invention, in the case of comprising the position measurement unit, the first mark plate, and the second mark plate, when the exposure apparatus further comprises: a mask stage that holds a mask on which the pattern is formed; a drive unit which synchronously moves the mask stage and the substrate stage along the second axis direction; a mask side position measurement unit which measures a position of the mask stage; and a mark detection system for masks which measures a plurality of pairs of mask marks formed on both sides of the pattern on the mask in the first axis direction, a length of the second mark plate in the second axis direction can almost correspond to a length of the pattern in the second axis direction, and a length of the second mark plate in the first axis direction can be slightly longer than a length required to form the fiducial mark. In such a case, it becomes to possible to form a fiducial mark that can be used for scaling adjustment between the mask side position measurement unit and the position measurement unit that measures the position of the substrate stage using one of the detection systems for masks, on the second fiducial mark plate.

According to the third aspect of the present invention, there is provided a second exposure apparatus which exposes a substrate with an energy beam and forms a predetermined pattern on the substrate, the exposure apparatus comprising: a substrate stage that moves two-dimensionally; a position measurement unit that measures a position of the substrate stage; a substrate holding member mounted on the substrate stage that holds the substrate; at least three fiducial marks that are respectively arranged in the vicinity of each vertex position of a polygon that contains a center of the substrate holding member, and are arranged on the substrate stage with a positional relationship between each of said fiducial marks and the substrate holding member constant; a mark detection system which detects marks located on the substrate stage including the fiducial marks; and a control unit that performs various types of measurement sequences respectively including a detection operation to detect either of one and a plurality of at least three fiducial marks using the mark detection system and the position measurement unit.

With this exposure apparatus, since the respective fiducial marks are arranged in the vicinity of each vertex of the polygon, the interval (distance) between the fiducial marks can be sufficiently large, and limitations on the measurement span can be relaxed, allowing the measurement accuracy to be improved. In addition, the center of the substrate holding member lies within the area of the polygon surrounded by the fiducial marks, therefore, in the case of obtaining the center of the substrate holding member based on the measurement results of the position of the fiducial marks, the central point corresponds, so to speak, to the interpolation point of the fiducial mark positions. Accordingly, the controller can, for example, detect the positional information on each fiducial mark arranged on the substrate stage by using the mark detection system and the position measurement, and by performing a predetermined calculation based on the positional information, the holding member coordinate system which origin is the center of the substrate holding member can be obtained with a sufficient level of reliability. Furthermore, the control unit obtains the positional information on the alignment marks that lie within the polygon on the substrate using the mark detection system and the position measurement unit based on an arbitrary coordinate system, such as the stage coordinate system, and converts the information to the positional information based on the holding member coordinate system. This allows the fiducial marks to be re-measured based on a new coordinate system, even in the case when the position of the substrate stage cannot be controlled temporarily, and based on the measurement results and the positional information based on the holding member coordinate system, the positional information on the alignment marks can be obtained with high reliability based on the new coordinate system. Accordingly, for similar reasons explained earlier, it becomes possible to control the position of the substrate with good accuracy at all times, without increasing the size of the substrate stage and the footprint of the apparatus.

In this case, each of the fiducial marks may be formed directly on the substrate stage, however, for example, the exposure apparatus may further comprise: a plurality of fiducial mark plates on which at least one of the fiducial marks is respectively formed, the fiducial mark plates arranged on a periphery of the substrate holding member on the substrate stage.

In this case, the at least three fiducial marks can be arranged on the plurality of fiducial mark plates, dispersed by each measurement sequence which uses at least one of the fiducial marks. In such a case, by dispersing the marks that normally are located in large numbers on the fiducial mark plate by their measurement sequences, the fiducial mark plates can each be downsized while maintaining its functions, and as a consequence, the substrate stage on which the fiducial mark plates are arranged and the whole exposure apparatus can be downsized.

In this case, a position of the substrate stage is controlled with the position measurement unit based on an orthogonal coordinate system, and the plurality of fiducial mark plates can include a first mark plate on which a plurality of fiducial marks are arranged along a first axis direction of the orthogonal axis, the first mark plate narrowly extending in the first axis direction, and a second mark plate on which a plurality of fiducial marks are arranged along a second axis direction orthogonal to the first axis, the second mark plate narrowly extending in the second axis direction. In such a case, by dispersing the fiducial marks existing in large numbers by their measurement sequences, the fiducial mark plates can each be downsized while maintaining the performance, and as a consequence, the substrate stage on which the fiducial mark plates are arranged can be downsized.

In addition, for example, with the scanning type exposure apparatus, in the case the first axis direction is the non-scanning direction of the substrate, by the first mark plate having approximately the size of the shot area on the substrate in this direction and a small size in the scanning direction, it becomes possible to form fiducial marks on the fiducial mark plate that can be measured at the same time with both eyes with a pair of mark detection system for masks that make up a twin lens which measures the mask alignment marks formed on both edges of the mask. Whereas, in the case the second axis direction is the scanning direction, by the second mask plate having approximately the size of the shot area in this direction and a small size in the non-scanning direction, it becomes possible to form fiducial marks on the fiducial mark plate that can be used for scaling adjustment of the interferometer which measures the position of the mask stage and the interferometer which measures the position of the substrate stage, which is performed using a single lens of the mark detection system for masks.

With the second exposure apparatus according to the present invention, at least three fiducial marks can be respectively formed on the substrate holding member.

According to the fourth aspect of the present invention, there is provided a third exposure apparatus which exposes a substrate with an energy beam and forms a predetermined pattern on the substrate, the exposure apparatus comprising: a substrate stage that moves two-dimensionally; a position measurement unit that measures a position of the substrate stage; a substrate holding member mounted on the substrate stage that holds the substrate; at least two fiducial marks including a first fiducial mark and a second fiducial mark which are arranged on a straight line passing through a center of the substrate holding member on opposite sides with respect to the center, and are arranged on the substrate stage with a positional relationship between each of the fiducial marks and the substrate holding member constant; a mark detection system which detects marks located on the substrate stage including the at least two fiducial marks; and a control unit that performs various types of measurement sequences respectively including a detection operation to detect either of one and a plurality of the at least two fiducial marks using the mark detection system and the position measurement unit.

With this exposure apparatus, since the first fiducial mark and the second fiducial mark are arranged on a straight line passing through the center of the substrate holding member on opposite sides with respect to the center, the interval between both fiducial marks can be about the diameter of the substrate holding member, therefore, limitations on the measurement span can be relaxed, allowing the measurement accuracy to be improved. In addition, the center of the substrate holding member lays on the straight line connecting both fiducial marks, therefore, in the case of obtaining the center of the substrate holding member based on the measurement results of the position of the fiducial marks, the central point corresponds, so to speak, to the interpolation point of the fiducial mark positions. Accordingly, the controller can, for example, detect the positional information on each fiducial mark arranged on the substrate stage by using the mark detection system and the position measurement, and by performing a predetermined calculation based on the positional information, the holding member coordinate system which origin is the center of the substrate holding member can be obtained with a sufficient level of reliability. Furthermore, the control unit obtains the positional information on the alignment marks that lie within the polygon on the substrate using the mark detection system and the position measurement unit based on an arbitrary coordinate system, such as the stage coordinate system, and converts the information to the positional information based on the holding member coordinate system. This allows the fiducial marks to be re-measured based on a new coordinate system, even in the case when the position of the substrate stage cannot be controlled temporarily, and based on the measurement results and the positional information based on the holding member coordinate system, the positional information on the alignment marks can be obtained with high reliability based on the new coordinate system. Accordingly, for similar reasons explained earlier, it becomes possible to control the position of the substrate with good accuracy at all times, without increasing the size of the substrate stage and the footprint of the apparatus. Also, in this case, since the two fiducial marks are symmetrical with respect to the center of the substrate holding member, it is possible, for example, to easily calculate the center coordinates and the rotational angle of the substrate holding member.

In this case, the exposure apparatus can further comprise: a plurality of fiducial mark plates arranged on a periphery of the substrate holding member on the substrate stage, on which one of the at least two fiducial marks is respectively formed.

In this case, at least two fiducial marks can be arranged on a plurality of fiducial mark plates, dispersed by each measurement sequence which uses any one of the fiducial marks.

In this case, a position of the substrate stage is controlled with the position measurement unit based on an orthogonal coordinate system, and the plurality of fiducial mark plates can include a first mark plate on which a plurality of fiducial marks including the first fiducial mark are arranged along a first axis direction of the orthogonal axis, the first mark plate narrowly extending in the first axis direction, and a second mark plate on which a plurality of fiducial marks including the second fiducial mark are arranged along a second axis direction orthogonal to the first axis, the second mark plate narrowly extending in the second axis direction.

With the third exposure apparatus according to the present invention, at least two fiducial marks can be respectively formed on the substrate holding member.

In addition, with the third exposure apparatus according to the present invention, a position of the substrate stage can be controlled with the position measurement unit based on an orthogonal coordinate system, and the straight line connecting the first fiducial mark and the second fiducial mark can be tilted at an angle of approximately 45° with respect to both coordinate axes of the orthogonal coordinate system.

In such a case, since the straight line that connects the first fiducial mark and second fiducial mark has a tilt at an angle of approximately 45° with respect to the coordinate axes of the orthogonal coordinate system, it becomes possible to measure the position of the mark with the accuracy of the same level in the direction of both axes in the orthogonal coordinate system.

In the detection operations of the fiducial marks with the exposure apparatus in the present invention, the positional information on the fiducial marks (for example, coordinate values on the orthogonal coordinate system which sets the movement of the substrate stage) does not necessarily have to be detected. For example, the fiducial marks may only be used for detection of the positional information (including the relative positional relationship with the fiducial marks) of marks formed on the mask or the mask stage or the like, or for detecting the optical properties (such as projection magnification) of the projection optical system. For example, the projection magnification of the projection optical system can be easily obtained by detecting the relative positional relationship between a plurality of marks formed on the mask or the mask stage and a plurality of fiducial marks corresponding to these marks formed on the substrate stage, or by detecting the positional relationship between a plurality of marks on the mask stage side, and the positional relationship between a plurality of fiducial marks on the substrate stage side. The correspondence of the mask coordinate system and the substrate coordinate system can also be obtained by detecting the relative positional relationship between a plurality of marks formed on the mask or the mask stage at a predetermined interval in a predetermined direction and a plurality of fiducial marks corresponding to these marks on the substrate stage.

Furthermore, fiducial marks on the substrate stage in the present invention refers not only to fiducial marks formed directly on the substrate stage and fiducial marks formed on mark plates fixed on the substrate stage, but also includes fiducial marks formed on the substrate holding member or on the mark plates fixed on the substrate holding member.

DESCRIPTION OF THE PREFERRED EMBODIMENTS

An embodiment of the present invention will be described below, with reference to FIGS. 1 to 4.

Figure 1:
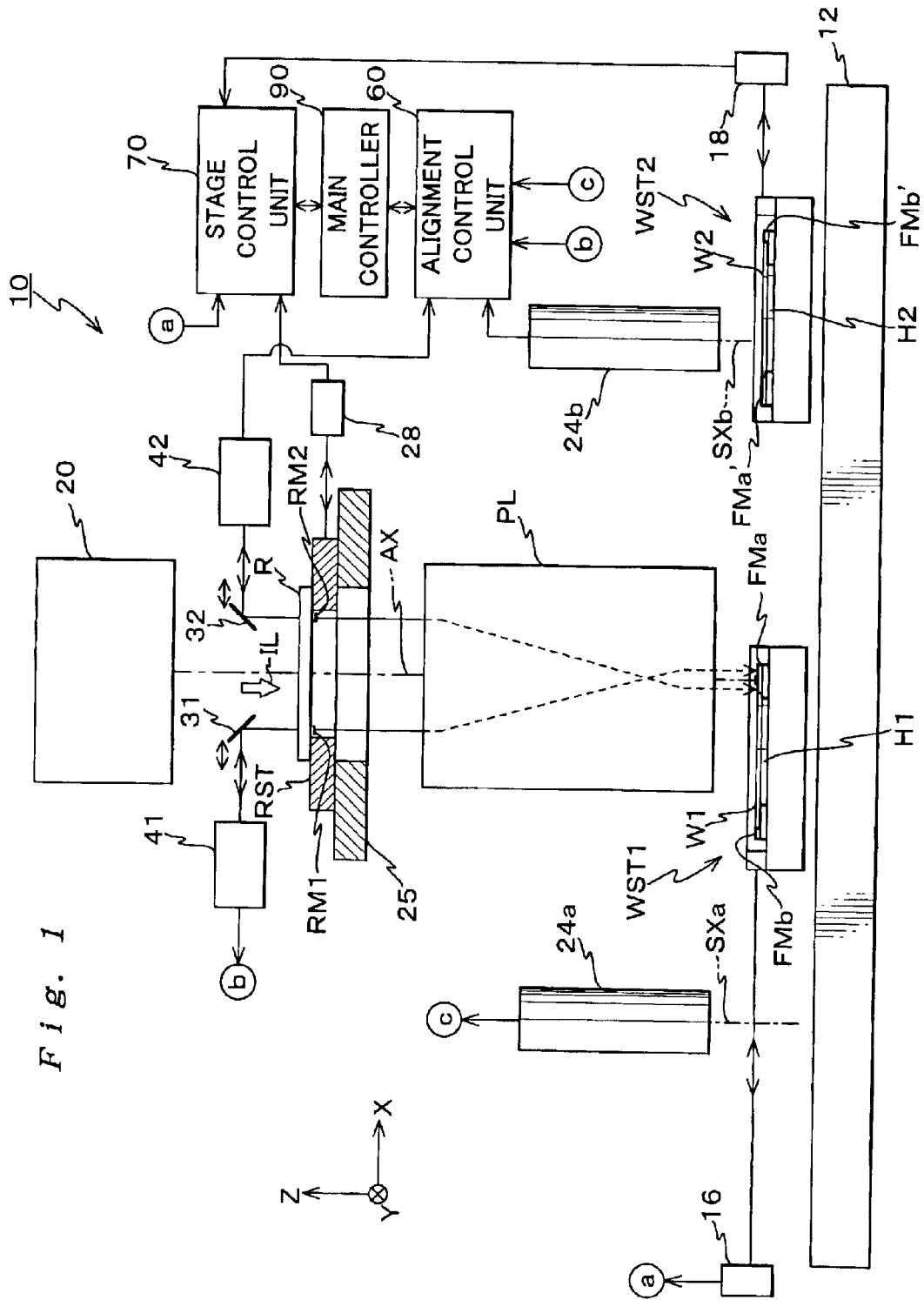
FIG. 1 is a view showing the schematic arrangement of an exposure apparatus in an embodiment related to the present invention.

FIG. 1 shows a schematic arrangement of an exposure apparatus 10 related to the present invention. The exposure apparatus 10 is a scanning exposure apparatus based on the so-called step-and-scan method.

The exposure apparatus 10 comprises: an illumination system 20 which illuminates the reticle R serving as a mask from above with an exposure light IL; a reticle drive system which drives the reticle R mainly in the scanning direction (in this case, the Y-axis direction which is the direction perpendicular to the page surface in FIG. 1); a projection optical system PL which is arranged below the reticle R; a stage unit arranged below the projection optical system PL that includes wafer stages WST1 and WST2 serving as substrate stages which move independently in two dimensional directions and respectively hold wafers W1 and W2 serving as substrates; a control system to control each of these portions, and the like.

As is disclosed, for example, in the Japanese Patent Laid Open (unexamined) No. 10-112433, the Japanese Patent Laid Open No. 06-349701 and its corresponding U.S. Pat. No. 5,534,970, the illumination system 20 has an arrangement that includes: a light source; an illuminance uniformity optical system which includes an optical integrator; a relay lens; a variable ND filter; a reticle blind; a dichroic mirror, and the like (all are omitted in Figs). As the optical integrator, a fly-eye lens, a rod integrator (an internal reflection type integrator), a diffraction optical element or the like can be used. The disclosures cited above are fully incorporated herein by reference.

With the illumination system 20, an exposure light IL serving as an energy beam illuminates the illumination area with uniform illuminance on the reticle R where the circuit pattern is formed, which is set in a slit shape by the reticle blind. As the exposure light IL, in this embodiment, a far ultraviolet light such as the KrF excimer laser beam (wavelength: 248 nm) or the ArF excimer laser beam (wavelength: 193 nm), or a vacuum ultraviolet light such as the $F_2$ laser beam (wavelength: 157 nm) is to be used. It is also possible to use the emission line (such as the g line or the i line) in the ultraviolet light region from an ultra-high pressure mercury lamp as the exposure light IL.

The reticle drive system comprises: a reticle stage RST that holds the reticle R and is capable of moving within the XY two-dimensional plane along the reticle base plate 25 shown in FIG. 1; a reticle drive portion which includes linear motors and the like (not shown in Figs.) to drive the reticle stage RST; and a reticle interferometer system 28 which controls the position of the reticle stage RST.

More particularly, the reticle stage RST is, in actual, supported by air levitation on the reticle base plate 25 via a non-contact bearing (not shown in Figs.) such as a vacuum pre-load aerostatic bearing unit. It is made up of a reticle coarse movement stage that is driven with predetermined strokes in the Y-axis direction which is the scanning direction by a linear motor (not shown in Figs.) and a reticle fine movement stage that is driven with respect to the reticle coarse movement stage in the X-axis, Y-axis, and θz direction (rotational direction around the Z-axis) by a drive mechanism consisting of a voice coil motor or the like. And, on the reticle fine movement stage, the reticle R is held by suction via electrostatic chucking or vacuum chucking (not shown in Figs.). Although it is omitted in the drawings, as is disclosed in, for example, in the Japanese Patent Laid Open No. 08-63231 and the corresponding U.S. Pat. No. 6,246,204, the reaction force generated by the movement of the reticle coarse movement stage is excluded by relatively moving the mover and stator of the linear motor which drives the reticle coarse movement stage in the opposite direction with respect to the reticle base plate 25. The disclosure of the U.S. Patent cited above is fully incorporated herein by reference.

As is referred to above, the reticle stage RST is actually made up of two stages, however, for the sake of convenience, the reticle stage RST will hereinafter be described as a single stage that is finely driven in the X-axis and Y-axis direction, finely rotated in the θz direction, and scanned in the Y-axis direction by the reticle drive portion (not shown in Figs.).

Figure 2:
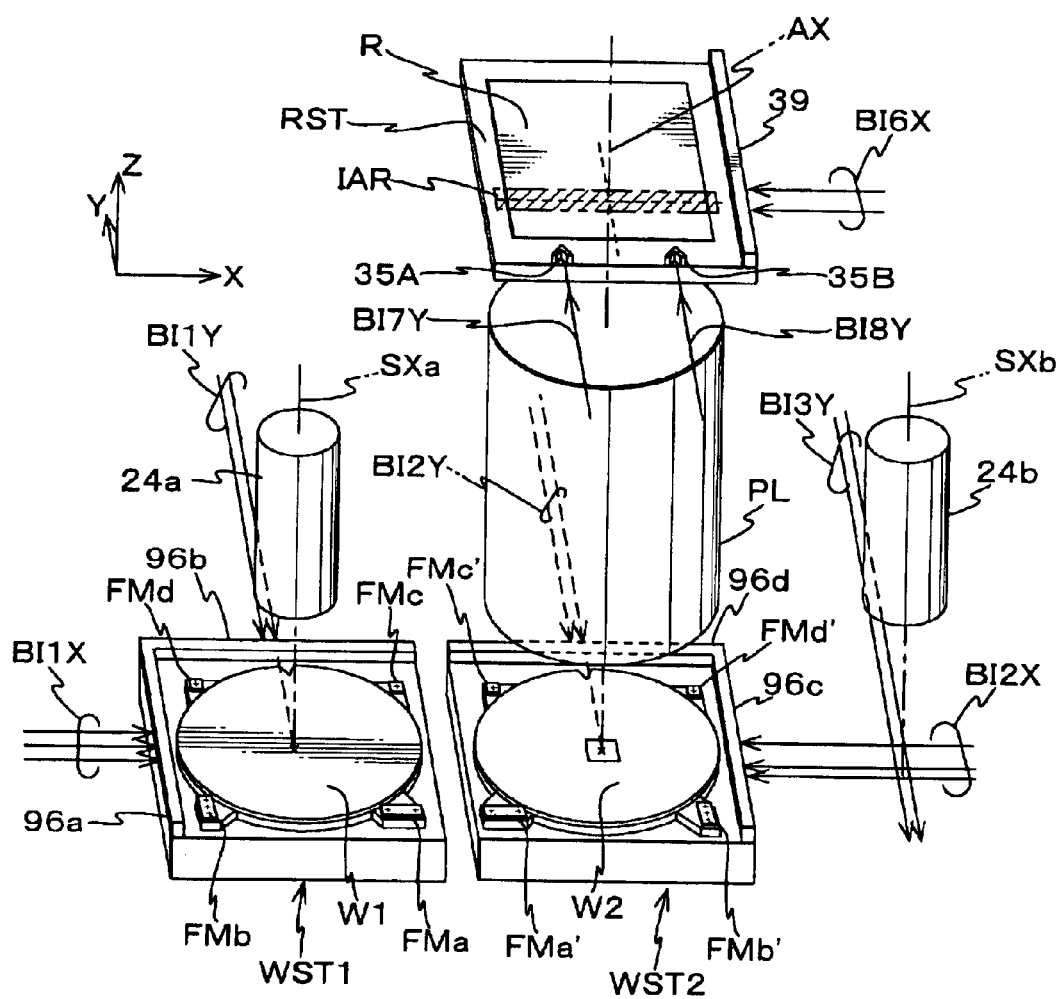
FIG. 2 is a perspective view showing the positional relationship between the two wafer stages, the reticle stage, the projection optical system, and the alignment system.

On the edge portion on the − side (+X side) in the X-axis direction on the reticle stage RST, as is shown in FIG. 2, a parallel plate movable mirror 39 made of the same material as the reticle stage RST (such as ceramic) extends in the Y-axis direction, and on the surface of the edge portion on the − side in the X-axis direction of the movable mirror 39 a reflection surface is formed by mirror polishing. And, on the reflection surface of the movable mirror 39, an interferometer that structures the interferometer system 28 shown in FIG. 1 and is referred to as the length measuring axis BI6X irradiates an interferometer beam. The reflected light is photo-detected and its relative displacement measured with respect to a reference surface by the interferometer so as to measure the position of the reticle stage RST. This interferometer that has the length measuring axis BI6X actually has two interferometer optical axes which are capable of individual measurement, and it can measure the position of the RST stage in the X-axis direction as well as the yawing amount (θz rotational amount). The interferometer having the length measuring axis BI6X is used to control the rotation of the reticle stage RST in the direction to cancel out the relative rotation (rotational error) between the reticle and the wafer and to perform the alignment of the reticle and wafer in the X direction, based on the information on yawing and X position of the wafer stage WST1 (or WST2) provided from the interferometer 16 (or 18) (refer to FIG. 3) arranged on the wafer stage side that has the length measuring axis BI1X (or BI2X). The interferometer 16 (or 18) will be described further, later on in the description.

Meanwhile, on the − side (the side close to the page surface in FIG. 1) in the Y-axis direction which is the scanning direction of the reticle stage RST, corner cube mirrors 35A and 35B are arranged in a pair. And on these corner cube mirrors 35A and 35B, a pair of double path interferometers (not shown in Figs.) irradiates interferometer beams that are shown as length measuring axes BI7Y and BI8Y in FIG. 2. The interferometer beams irradiated on the corner cube mirrors 35A and 35B are returned onto a reflection surface (not shown in Figs.) arranged on the reticle base plate 25. And, the reflected lights respectively reflected off the reflection surface (not shown in Figs.) return the same optical path and are respectively photo-detected by the double path interferometers, which measure the relative displacement from the reference positions of the respective corner cube mirrors 35A and 35B (the reflection surface on the reticle base plate 25). The measurement values of these double path interferometers are supplied to a stage control unit 70 (refer to FIG. 1), and, for example, the stage control unit 70 calculates the position of the reticle stage RST in the Y-axis direction based on the average of the measurement values. The calculation results of the stage control unit 70 are supplied to the main controller 90. The information on the position of the reticle stage RST in the Y-axis direction measured with the double path interferometers is used in order to calculate the positional relationship between the reticle stage RST and the wafer stage WST1 (or WST2) based on the measurement values of the Y-axis interferometer 46 on the wafer side (refer to FIG. 3) that has a length measuring axis BI2Y, and based on this calculation, to synchronously control the reticle and the wafer in the scanning direction (Y-axis direction) upon scanning exposure. The interferometer 46 will also be described further, later on in the description.

That is, in this embodiment, the interferometer represented by the length measuring axis BI6X and the pair of double path interferometers represented by the length measuring axes BI7Y and BI8Y make up the reticle interferometer system 28, which is shown in FIG. 1.

Also, the material of the glass substrate structuring the reticle R needs to be different depending on the light source used. For example, in the case of using a vacuum ultraviolet light such as the $F_2$ laser light as the light source, the glass substrate needs to be made of materials such as fluorite, or fluoride crystals such as magnesium fluoride or lithium fluoride, or synthetic quartz which has a hydroxyl concentration of 100 ppm or under and contains fluorine (fluorine doped quartz). Or, in the case of using the ArF excimer laser or the KrF excimer laser as the light source, other than the materials referred to above, it is possible to use synthetic quartz.

In this embodiment, as the projection optical system PL, a refraction optical system that is made up of a plurality of lens elements having a common optical axis in the Z-axis direction and is double telecentric with a predetermined reduction magnification such as ⅕ or ¼ is used. Therefore, the movement velocity of the wafer stage in the scanning direction upon scanning exposure based on the step-and-scan method is ⅕ or ¼ of the movement velocity of the reticle stage.

As is shown in FIG. 1, the stage unit comprises: two wafer stages WST1 and WST2 that are arranged above the base plate 12; a stage drive system that drives these wafer stages WST1 and WST2; and an interferometer system serving as a position measurement unit which measures the position of the wafer stages WST1 and WST2. The wafer stages WST1 and WST2 are supported by air levitation via a non-contact bearing (not shown in Figs.) such as a vacuum pre-load aerostatic bearing unit (hereinafter referred to as an "air pad") above the base plate 12 via a predetermined clearance. And, the wafer stages WST1 and WST2 are structured so that they can be driven independently in two-dimensional directions by the stage drive system, in the X-axis direction (the horizontal direction in FIG. 1) which is the first direction and the Y-axis direction (the vertical direction in FIG. 1) which is the second direction.

More particularly, on the bottom surface of the wafer stages WST1 and WST2, a plurality of air pads (not shown in Figs.) are arranged, and due to the balance of the air exhaustion force and the vacuum pre-load force of the air pads the wafer stages WST1 and WST2 are supported by air levitation above the base plate 12 in a state where, for example, a space of around several $\mu$m is maintained.

Figure 3:
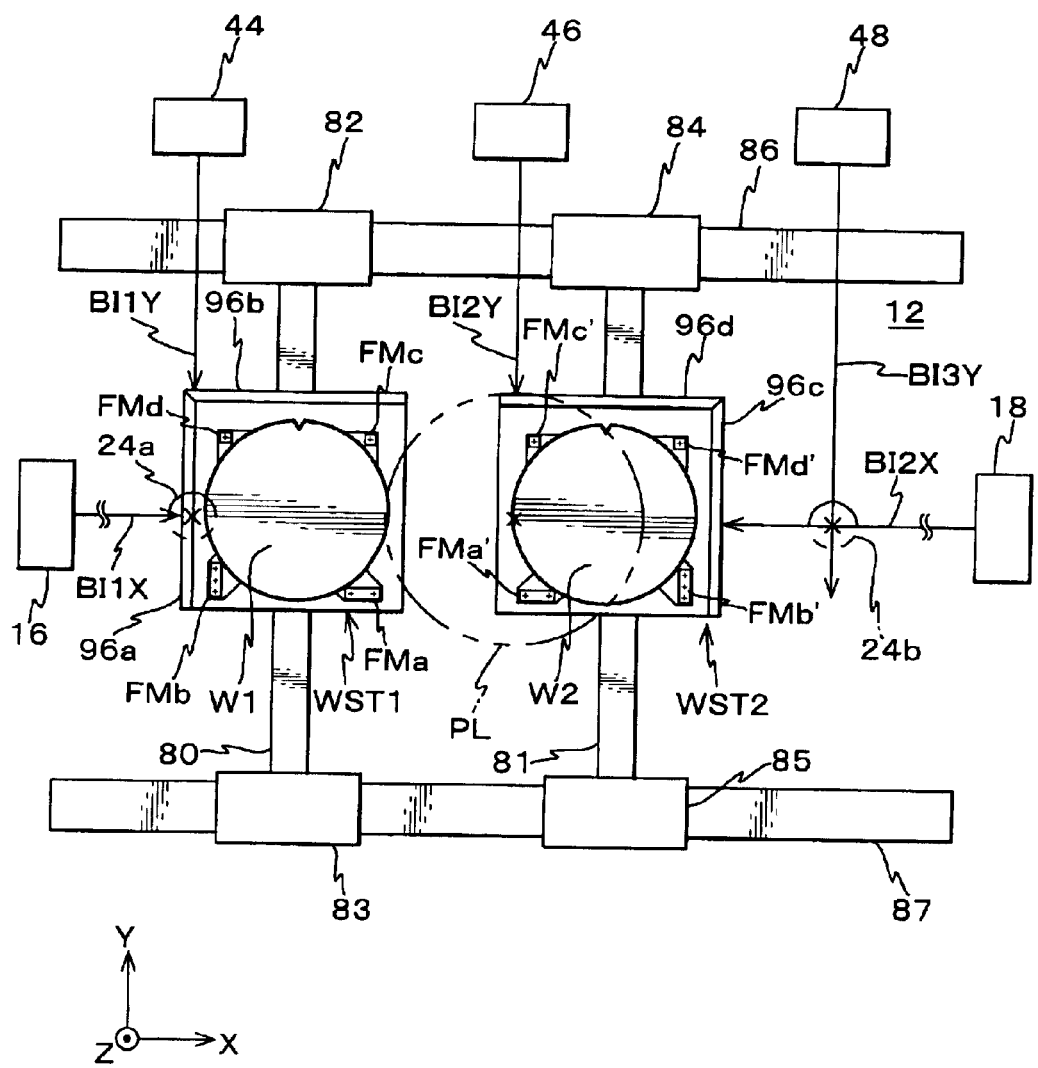
FIG. 3 is a planar view showing the arrangement of the stage unit in FIG. 1.

On the base plate 12, as is shown in the planar view in FIG. 3, X-axis linear guides (for example, a guide consisting of a magnetic pole unit that has a permanent magnet) 86 and 87 that extend in the X-axis direction are arranged in a pair at a predetermined interval along the Y-axis direction. Above these X-axis linear guides 86 and 87, two sliders each that are capable of moving along the X-axis linear guides, that is, sliders 82 and 84, and 83 and 85, are respectively supported by air levitation via air pads (not shown in Figs.), for example, via a clearance of around several $\mu$m. The sectional shape of the four sliders 82, 84, 83, and 85 is the shape of the letter U upside down as if the X-axis linear guides 86 and 87 were enclosed from above and from the sides, and the inner portion each contains an armature coil. That is, in this embodiment, the sliders (armature units) 82 and 84 and the X-axis linear guide 86 respectively make up the moving coil type X-axis linear motors. Likewise, the sliders (armature units) 83 and 85 and the X-axis linear guide 87 respectively make up the moving coil type X-axis linear motors. Hereinafter, the four X-axis linear motors that are mentioned above will each be referred to as X-axis linear motor 82, X-axis linear motor 84, X-axis linear motor 83, and X-axis linear motor 85 as appropriate, using the same reference numbers as the sliders 82, 84, 83, and 85 that make up the movers of the respective X-axis linear motors.

Of the four X-axis linear motors (sliders) 82 to 85, two of them, that is, the X-axis linear motors 82 and 83 are respectively fixed on one end and the other end in the longitudinal direction of the Y-axis linear guide (for example, made up of an armature unit that has an armature coil built in) 80 which extends in the Y-axis direction. In addition, the remaining two X-axis linear motors 84 and 85 are fixed on one end and the other end to a similar Y-axis linear guide 81 that also extends in the Y-axis direction. Accordingly, the Y-axis linear guides 80 and 81 are respectively driven along the X-axis by the X-axis linear motors 82, 83, 84, and 85 in pairs.

On the bottom portion of the wafer stage WST1, a magnetic pole unit (not shown in Figs.) that has a permanent magnet is arranged. This magnetic pole unit and one of the Y-axis linear guides, the Y-axis linear guide 80, make up the moving magnet type Y-axis linear motor, which drives the wafer stage WST1 in the Y-axis direction. Furthermore, on the bottom portion of the wafer stage WST2, a magnetic pole unit (not shown in Figs.) that has a permanent magnet is arranged. This magnetic pole unit and the other Y-axis linear guide, the Y-axis linear guide 81, make up the moving magnet type Y-axis linear motor, which drives the wafer stage WST2 in the Y-axis direction. Hereinafter, these Y-axis linear motors will be referred to as Y-axis linear motor 80 and Y-axis linear motor 81 as appropriate, using the same reference numbers as the linear guides 80 and 81 that make up the stators of the respective Y-axis linear motors.

In addition, in the embodiment, the X-axis linear motors 82 to 85 and the Y-axis linear motors 80 and 81 are respectively controlled by the stage control unit 70, which is shown in FIG. 1.

Also, the yawing of the wafer stage WST1 (or WST2) can be controlled by slightly varying the thrust respectively generated by the pair of X-axis linear motors 82 and 83 (or 84 and 85).

Referring back to FIG. 1, a wafer holder H1 serving as a substrate holding member is arranged on the wafer stage WST1. On the upper surface of the wafer holder H1, as is shown in FIG. 4, a plurality of projected portions 72 which are concentric circles having different radiuses are formed, and through the suction holes (not shown in Figs.) arranged on the bottom surface of the groove portions formed between these projected portions 72 the wafer W1 is held by suction on the wafer holder H1 by the vacuum chucking force of the vacuum pump (not shown in Figs.).

Figure 4:
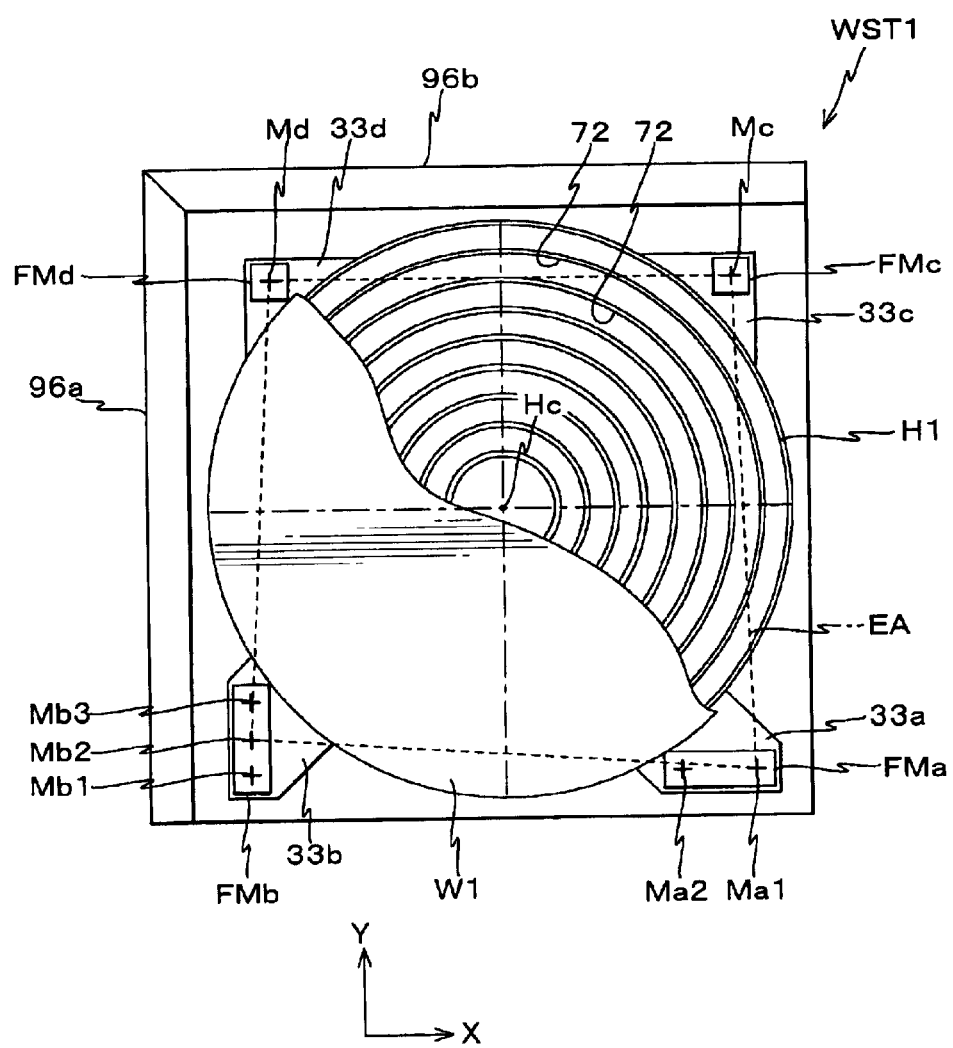
FIG. 4 is a view showing a specific arrangement method of the fiducial mark plates on the wafer stage.

And, as is also shown in FIG. 4, at predetermined positions on the peripheral portion of the wafer holder H1 (more particularly, in the vicinity of the corners of the squarish shape formed outside the wafer holder H1), four fiducial mark plates FMa, FMb, FMc, and FMd on which fiducial marks are respectively formed are arranged so that the surface of these plates and the surface of the wafer W1 are at the same height. These fiducial mark plates FMa, FMb, FMc, and FMd are each integrally fixed to the wafer holder H1 via the fiducial mark plate holding portions 33a, 33b, 33c, and 33d. That is, the positional relationship between the fiducial mark plates FMa, FMb, FMc, and FMd and the wafer holder HI is constant.

On the upper surface of the fiducial mark plate FMa, as is shown in FIG. 4, fiducial marks Ma1 and Ma2 are formed in a pair in the X-axis direction at a predetermined interval. These fiducial marks Ma1 and Ma2 are arranged at a position where both marks can be measured at the same time with both eyes using a pair of RA microscopes 41 and 42 (refer to FIG. 1) that make up a twin lens. The fiducial mark plate FMa on which the fiducial marks Ma1 and Ma2 are formed has a rectangular shape in a planar view, and the X-axis direction side of the plate almost matches the shot area on the wafer W1 whereas the Y-axis direction side is just long enough to form the fiducial marks.

Furthermore, on the fiducial mark plate FMb, three fiducial marks Mb1, Mb2, and Mb3 are formed in the Y-axis direction at a predetermined interval. These fiducial marks Mb1, Mb2, and Mb3 are for the so-called scaling measurement which is performed upon the so-called baseline measurement between interferometers that respectively measure the position of the reticle stage RST and wafer stage WST1, in other words, these are marks used for alignment confirmation during relative scanning operation. The fiducial mark plate FMb on which these fiducial marks Mb1 Mb2, and Mb3 are formed has a rectangular shape in a planar view, and the Y-axis direction side of the plate almost matches the shot area on the wafer W1 whereas the X-axis direction side is just long enough to form the fiducial marks.

In addition, on the remaining fiducial mark plates FMc and FMd, the fiducial marks Mc and Md are respectively formed. These fiducial marks Mc and Md are used in cases when the center of the wafer holder H1 or the rotation of the wafer holder H1 or the like has to be calculated by the least squares method. The various measurement methods using each of the fiducial marks formed on the respective fiducial mark plates referred to above will be described later on in the description.

In this case, since the fiducial mark plates FMa, FMb, FMc, and FMd are arranged so that they are located on the corners of a squarish shape (almost a square) that includes the center of the wafer holder H1, the entire surface of the wafer W1 is enclosed in the area within the squarish shape (the area EA surrounded with the dotted line in FIG. 4). The reason for this will be explained later in the description.

On the upper surface of the wafer stage WST1, an X movable mirror 96a, which has a reflection surface perpendicular to the X-axis, is arranged on one end in the X-axis direction (the end on the −X side) extending in the Y-axis direction. And, a Y movable mirror 96b, which has a reflection surface perpendicular to the Y-axis, is arranged on one end in the Y-axis direction (the end on the +Y side) extending in the X-axis direction. And, on each of the reflection surfaces of the movable mirrors 96a and 96b, as is shown in FIG. 2 and FIG. 3, interferometer beams (length measuring beams) from interferometers that have a predetermined length measuring axis and structure the interferometer system (which will be described later) are projected. The reflected lights are photo-detected by the respective interferometers, which allows the displacement of the reflection surface of each movable mirror from the reference position (normally, the reference surface is set by arranging a fixed mirror on the side surface of the projection optical system PL or the alignment system) to be measured, which, in turn, allows the two-dimensional position of the wafer stage WST1 to be measured.

Although the two wafer stages are symmetrical, the structure of the other wafer stage, WST2, is similar to that of the wafer stage WST1 described above.

That is, as is shown in FIG. 1, a wafer W2 is vacuum chucked via a vacuum chuck (not shown in Figs.) on the wafer stage WST2 via a wafer holder H2, which serves as a substrate holding member. The wafer holder H2 basically has a structure similar to that of the wafer holder H1 referred to earlier, and as is shown in FIG. 2 and FIG. 3, four fiducial mark plates FMa', FMb', FMc', and FMd' are arranged in a predetermined positional relationship on the peripheral portion of the wafer holder H2, to be more specific, at a position on each corner of the squarish shape which is almost a perfect square, and the fiducial mark plates are each integrally fixed to the wafer holder H2 via the fiducial mark plate holding portions. These fiducial mark plates FMa', FMb', FMc', and FMd' are arranged so that their upper surface is set at the same height as of the surface of the wafer W2 mounted on the wafer holder H2. Furthermore, on the upper surface of the wafer stage WST2, movable mirrors 96c and 96d are each extensively arranged. On these movable mirrors 96c and 96d, as is shown in FIG. 2, interferometer beams from interferometers that have a predetermined length measuring axis and structure the interferometer system (which will be described later) are projected. The reflected lights are photo-detected by the respective interferometers, thus the two-dimensional position of the wafer stage WST2 is measured.

Also, as is shown in FIG. 2 and FIG. 3, the fiducial mark plates on the wafer stage WST2 that correspond to the fiducial mark plates on the wafer stage WST1 are designated with an "'" added to the reference number used for the wafer stage WST1. Therefore, hereinafter in the description, the fiducial marks will also be designated with an "'", likewise with the fiducial mark plates for the sake of convenience.

Referring back to FIG. 1, on both sides of the projection optical system PL in the X-axis direction, alignment systems 24a and 24b that are based on the off-axis method and have the same functions are arranged at positions equally apart from the optical axis of the projection optical system PL (coincides with the projection center of the reticle pattern image). In this embodiment, as the alignment systems 24a and 24b, FIA (Filed Image Alignment) system microscopes based on the image processing method are used, where a broadband detection light which does not expose the resist on the wafer is irradiated on the target mark so that an image is formed from the light reflected off the subject mark on the photodetection surface, and this image and an index image (not shown in Figs.) are picked up with a pick-up device (CCD) or the like, and the pick-up signals output. And, based on the output of the alignment systems 24a and 24b, it becomes possible to measure the position of the fiducial marks on the fiducial mark plates as well as the alignment marks on the wafers in the XY two-dimensional directions.

Other than the FIA system, it is possible, for example, to use a single or a combination of alignment sensors as the alignment system 24a and 24b, so that a coherent detection light is irradiated on the target mark and the scattered light or diffraction light generated from the mark is detected, or the two diffraction lights (for example, lights of the same order) generated from the target mark made to interfere with each other are detected.

In the embodiment, the alignment system 24a is used to measure the position of the alignment marks on the wafer W1 held on the wafer stage WST1 and the position of the fiducial marks formed on each of the fiducial mark plates on the wafer stage WST1 and the like. Also, the alignment system 24b is used to measure the position of the alignment marks on the wafer W2 held on the wafer stage WST2 and the position of the fiducial marks formed on each of the fiducial mark plates on the wafer stage WST2 and the like.

The information from the alignment systems 24a and 24d is converted from analog to digital by the alignment control unit 60, and the digitalized waveform signals are processed to detect the mark positions, that is, the positional information of the target marks subject to detection with the index center of the respective alignment systems 24a and 24b as the reference. The detection results from the alignment control unit 60 is sent to the main controller 90, and in accordance with the results the main controller 90 gives instructions to the stage control unit 70 on synchronous positional correction during exposure and the like.

The structure of the interferometer system that controls the position of the wafer stage WST1 and WST2 and the like will be described next, with reference to FIGS. 1 to 4.

As shown in these Figs., the movable mirror 96a is arranged on one side of the X-axis direction on the upper surface of the wafer stage WST1 along the first axis (X-axis), which passes through the projection center (optical axis AX) of the projection optical system PL as well as each detection center (optical axes SXa and SXb) of the alignment systems 24a and 24b. The interferometer beam from the X-axis interferometer 16, referred to as the length measuring axis BI1X in FIG. 1, is irradiated on the movable mirror 96a, and similarly, the interferometer beam from the X-axis interferometer 18, referred to as the length measuring axis BI2X in FIG. 1, is irradiated on the movable mirror 96c, which is also arranged along the first axis on the upper surface of the wafer stage WST2, on the other side of the X-axis direction. And, the interferometers 16 and 18 measure the relative displacement from the reference position of each reflection surface by photo-detecting the reflected lights, and thus the position of the wafer stages WST1 and WST2 in the X-axis direction is measured. As is shown in FIG. 2, the interferometers 16 and 18 are a three axes interferometer, each having three optical axes, and other than the measurement of the position of the wafer stages WST1 and WST2 in the X-axis direction, measurement of the rotational amount around the Y-axis (rolling amount) and the rotational amount around the Z-axis (yawing amount) is possible. In the description so far, the wafer stages WST1 and WST2 are described as if they were both a single stage, however, in actual, they both comprise a stage main body respectively driven by the Y-axis motors 80 and 81 and a wafer table placed on the upper portion of the stage main body via a Z leveling drive mechanism (not shown in Figs.). And the movable mirrors are respectively fixed to the wafer tables. Accordingly, upon tilt control, the interferometer 16 and 18 and the like can fully monitor the drive amount of the wafer table on which the wafer W is mounted.

As is described above, the wafer stages WST1 and WST2 are both made up of a plurality of parts such as the stage main body and the wafer table, however, for the sake of convenience on description, hereinafter, the wafer stages WST1 and WST2 will each be described as a single stage which is capable of moving in directions of five degrees of freedom, excluding the rotational direction around the Z-axis (the θz direction). As a matter of course, the wafer stage may be capable of moving in direction of six degrees of freedom, including the θz direction.

Furthermore, the interferometer beams of the length measuring axis BI1X and the length measuring axis BI2X are each set so that they irradiate the movable mirrors 96a and 96b of the wafer stages WST1 and WST2 at all times, in the entire movement area of the wafer stages WST1 and WST2. Accordingly, the position of the wafer stages WST1 and WST2 in the X-axis direction is controlled based on the measurement values of the length measuring axis BI1X and the length measuring axis BI2X at times such as when exposure is performed using the projection optical system PL and when the alignment systems 24a and 24b are used.

In addition, in this embodiment, as is shown in FIG. 2 and FIG. 3, a Y-axis interferometer 46 having the length measuring axis BI2Y which crosses perpendicularly with the X-axis at the detection center of the projection optical system PL and Y-axis interferometers 44 and 48 respectively having the length measuring axes BI1Y and BI3Y which respectively cross perpendicularly with the X-axis at the detection center of the respective alignment systems 24a and 24b are arranged.

In this case, when the position of the wafer stages WST1 and WST2 in the Y-axis direction upon exposure is to be measured using the projection optical system PL, the measurement values of the interferometer 46 having the length measuring axis BI2Y which passes through the projection center of the projection optical system PL, or in other words, the optical axis AX, are used. When the position of the wafer stage WST1 in the Y-axis direction is to be measured during the usage of the alignment system 24a, the measurement values of the interferometer 44 having the length measuring axis BI1Y that passes through the detection center of the alignment system 24a, or in other words, the optical axis SXa, are used. And, when the position of the wafer stage WST2 in the Y-axis direction is to be measured during the usage of the alignment system 24b, the measurement values of the interferometer 48 having the length measuring axis BI3Y that passes through the detection center of the alignment system 24b, or in other words, the optical axis SXb, are used.

Accordingly, due to each usage conditions, the length measuring axes of the interferometers in the Y-axis direction stray off the reflection surface of the movable mirrors 96b and 96d arranged on the upper surface of the wafer stages WST1 and WST2. However, since at least one length measuring axis, that is, the length measuring axes BI1X and BI2X referred to earlier stays within the range of the movable mirrors 96a and 96c of the respective wafer stages WST1 and WST2, the interferometers on the Y side can be reset at an appropriate position where the optical axis of the interferometer to be used comes in and is reflected off the reflection surface.

As is shown in FIG. 2, the interferometers used for measurement of the Y-axis side, 44, 46, and 48 are a double axes interferometer each having two optical axes, and besides the measurement of the wafer stages WST1 and WST2 in the Y-axis direction, the rotational amount around the X-axis (pitching amount) can be measured. The output values of each optical axis can be measured independently.

In this embodiment, a total of five interferometers—two X-axis interferometers 16 and 18, and three Y-axis interferometers 44, 46, and 48—make up the interferometer system to control the two-dimensional coordinate positions of the wafer stages WST1 and WST2.

In addition, in this embodiment, as it will be referred to later on, when either one of the wafer stages WST1 or WST2 is executing the exposure sequence, the other stage performs wafer exchange or executes the wafer alignment sequence. During these operations, the stage control unit 70 controls the movement of the wafer stages WST1 and WST2 in accordance with instructions from the main controller 90 based on the output values of each interferometer, so that both stages do not interfere with each other.

Furthermore, with the exposure apparatus 10 in the embodiment, as is shown in FIG. 1, a pair of reticle alignment microscopes (hereinafter referred to as "RA microscope" for the sake of convenience) 41 and 42 are arranged above the reticle R. These RA microscopes are consisting of a TTR (Through The Reticle) alignment optical system that uses the exposure wavelength to observe the reticle mark RM1 and RM2 on the reticle R and the marks on the fiducial mark plates at the same time via the projection optical system PL. The detection signals from the RA microscopes are sent to the main controller 90 via the alignment control unit 60. In this case, deflection mirrors 31 and 32 are arranged freely movable so as to respectively guide the detection light from the reticle R to the RA microscopes 41 and 42, and when the exposure sequence begins, they are respectively withdrawn by a mirror drive unit (not shown in Figs.), based on instructions from the main controller 90. Furthermore, details of the structure similar to the RA microscopes 41 and 42 are disclosed, for example, in the Japanese Patent Laid Open No. 07-176468 and the corresponding U.S. Pat. No. 5,646,413. The disclosure of the U.S. Patent cited above is fully incorporated herein by reference.

In addition, although it is omitted in the drawings, the projection optical system PL, alignment systems 24a and 24b respectively have an automatic focusing/automatic leveling measurement mechanism (hereinafter referred to as "AF/AL system") to find the focusing position. Of these mechanisms, the AF/AL system in the projection optical system PL is arranged to detect whether the exposure surface of the wafer (W1 or W2) is within the focal depth range of the image plane of the projection optical system PL (whether the exposure surface is focused or not). The reason this is necessary, is because when the pattern of the reticle R is to be transferred accurately onto the wafer (W1 or W2) by scanning exposure, the surface on which the pattern is formed on the reticle R and the exposure surface on the wafer (W1 or W2) need to be conjugate at all times with respect to the projection optical system PL. In this embodiment, as the AF/AL system, the so-called multiple focal position detection system is used which details are disclosed, for example, in the Japanese Patent Laid Open No. 06-283403 and the corresponding U.S. Pat. No. 5,448,332. The disclosure of the U.S. Patent cited above is fully incorporated herein by reference.

Also, the AF/AL systems arranged in the alignment systems have a similar structure, and alignment measurement with high precision becomes possible by performing positional measurement of the alignment marks while executing the automatic focusing/automatic leveling based on measurement and control by the AF/AL system likewise as on exposure, when measurement is being performed with the alignment sensors of the alignment systems 24a and 24b.

The control system of the exposure apparatus 10 is made up of a microcomputer (or a workstation) and the like, as is shown in FIG. 1, and is structured with the main controller 90 serving as the control unit that has overall control over the entire apparatus, the stage control unit 70 which is under the control of the main controller 90, the alignment control unit 60, and the like as the core.

Next, the simultaneous parallel processing performed on the two wafer stages WST1 and WST2 of the exposure apparatus 10 related to this embodiment will be described, with focus on the operations of each portion structuring the control system shown in FIG. 1. And, the following description will be centering on the wafer alignment operation.

The case will first be described when exposure operations are performed on the wafer W2 on the wafer stage WST2 side, while alignment operations are performed in parallel on the wafer W1 on the wafer stage WST1 side, as is shown in FIG. 2. It is to be noted that on the surface of the wafers W1 and W2, although it is not shown in the drawing, multiple shot areas (divided areas) have been formed at a predetermined pitch in the X-axis direction and in the Y-axis direction, and in each shot area the predetermined patterns, and the X-axis wafer marks and the Y-axis wafer marks used for alignment have already been respectively formed by the semiconductor manufacturing process conducted earlier. Each of these wafer marks will hereinafter be referred to as an "alignment mark" in general.

a. First of all, on the wafer stage WST2 side, exposure on the wafer W2 is performed in the following manner. That is, the stage control unit 70 moves the wafer stage WST2 so that the first shot area on the wafer W2 is positioned at the starting position for scanning exposure (acceleration starting position), by controlling the X-axis linear motors 84 and 85 and the Y-axis linear motor 81 while monitoring the measurement values of the interferometer 46 which has the length measuring axis BI2Y and the interferometer 18 which has the length measuring axis BI2X in the interferometer system. This operation is performed by the stage control unit 70 in accordance with the instructions from the main controller 90 based on the alignment results performed in advance, likewise with the alignment operation on the wafer W1, which will be referred to later in the description.

b. Next, the stage control unit 70 begins to relatively scan the reticle R and the wafer W2, that is, the reticle stage RST and the wafer stage WST2 in the Y-axis direction according to instructions from the main controller 90. And, when both the reticle stage RST and the wafer stage WST2 each reach their target scanning velocity and move into a synchronous state of constant velocity, the illumination system 20 starts irradiating the pattern area on the reticle R with the ultraviolet pulse light, and scanning exposure begins. The relative scanning described above is performed by the stage control unit 70, which controls the reticle drive portion, the X-axis linear motors 84 and 85, and the Y-axis linear motor 81, while monitoring the measurement values of interferometers 46 and 18 of the interferometer system referred to earlier which have the length measuring axes BI2Y and BI2X and the measurement values of the interferometers of the reticle interferometer system 28 which has the length measuring axes BI7Y, BI8Y, and BI6X.

c. Prior to the beginning of the scanning exposure, at the point where both stages RST and WST2 reach their target scanning velocity, the main controller 90 instructs the laser control unit (not shown in Figs.) to start pulse emission. The stage control unit 70, however, synchronously controls the movement of predetermined blades of the movable reticle blind within the illumination system 20 via a blind drive unit (not shown in Figs.) and the movement of the reticle stage RST. Therefore, this prevents the ultraviolet pulse light from being irradiated onto areas other than the pattern area on the reticle R, as is with the normal scanning steppers.

d. The stage control unit 70 synchronously controls the reticle stage RST and the wafer stage WST2 via the reticle drive portion, the X-axis linear motors 84 and 85, and the Y-axis linear motor 81. Upon this control, especially during the scanning exposure described above, the reticle stage RST and the wafer stage WST2 are synchronously controlled so that the movement velocity of the reticle stage RST in the Y-axis direction Vr and the movement velocity of the wafer stage WST2 in the Y-axis direction Vw are maintained at a velocity ratio corresponding to the projection magnification of the projection optical system PL (at a magnification of ¼ or ⅕).

e. Then, different areas of the pattern area on the reticle R are sequentially illuminated with the ultraviolet pulse light, and when the entire surface of the pattern area has been illuminated, scanning exposure on the first shot area of the wafer W2 is completed. In this manner, the pattern of the reticle R is reduced and transferred onto the first shot area via the projection optical system PL.

f. Furthermore, the blind drive unit (not shown in Figs.) synchronously controls the movement of the predetermined blades of the movable reticle blind and the movement of the reticle stage RST so as to cut off the irradiation of the ultraviolet pulse light onto areas other than the pattern area on the reticle R which has just completed scanning exposure, based on instructions from the stage control unit 70.

g. After the scanning exposure on the first shot area is completed as is described above, the stage control unit 70 steps the wafer stage WST2 in the X and Y-axis direction to the starting position for scanning exposure (acceleration starting position) on the second shot area via the X-axis linear motors 84 and 85 and Y-axis linear motor 81, based on instructions from the main controller 90. When this stepping operation is performed, the stage control unit 70 measures the positional displacement of the wafer stage WST2 in the X, Y, and θz directions real-time, based on the measurement values of interferometers 46 and 18 of the interferometer system which have the length measuring axes BI2Y and BI2X. And, based on the measurement results, the stage control unit 70 controls the position of the wafer stage WST2 so that the XY positional displacement of the wafer stage WST2 moves into a predetermined state. In addition, the stage control unit 70 controls the reticle drive portion based on displacement information of the wafer stage WST2 in the θz direction, and rotationally controls the reticle stage RST (reticle fine movement stage) in order to compensate for the error in rotational displacement on the wafer side.

h. Then, in accordance with instructions from the main controller 90, the stage control unit 70 and the laser control unit (not shown in Figs.) control the operation of each portion as is described above, and scanning exposure on the second shot area of the wafer W2 is performed, likewise as above.

i. In this manner, scanning exposure on the shot area on the wafer W2 and stepping operations to expose the following shot area are repeatedly performed, and the pattern of the reticle R is thus sequentially transferred onto the shot areas on the wafer W2 subject to exposure.

Also, the main controller 90 controls the exposure amount to be provided to each point on the wafer during the scanning exposure described above. The exposure amount can be controlled by controlling at least one of the light source (not shown in Figs.) oscillation frequency (the pulse repetition frequency), the pulse energy per pulse emitted from the light source, the attenuation ratio of the attenuation portion within the illumination system 20, and the scanning velocity of the wafer stage and the reticle stage, via the stage control unit or the laser control unit (not shown in Figs.).

Furthermore, for example, when the movement starting position (synchronous position) of the reticle stage and the wafer stage needs to be corrected on scanning exposure, the main controller 90 instructs the stage control unit 70 which controls the movement of each stage to correct the position of the stage in accordance with the correction amount.

In parallel with the exposure operations as is described in a.–i on the wafer W2, based on the step-and-scan method, on the wafer stage WST1 side, alignment operations are performed in the following manner on the wafer W1.

(1) As a premise, the wafer stage WST1 on which the wafer W1 is mounted, is to be located below the alignment system 24a (refer to FIG. 2). In this case, as is shown in FIG. 2, the position of the wafer stage WST1 is measured by the interferometers 44 and 16 that respectively have the length measuring axes BI1Y and BI1X, and is measured and controlled based on an alignment coordinate system set by the length measuring axes BI1Y and BI1X with the alignment system 24a as the origin. The positional information measured here is sent to the main controller 90 via the stage control unit 70.

(2) Next, the main controller 90 controls the movement of the wafer stage WST1 via the stage control unit 70, so that four fiducial marks Ma1, Mb2, Mc, and Md which are among the fiducial marks formed on the fiducial mark plates FMa to FMd arranged in the vicinity of the wafer holder H1 are sequentially set at a position within the detection field of the alignment system 24a. By this control, each time when the position is set, the positional shift of the fiducial marks Ma1, Mb2, Mc, and Md in the X-axis direction and Y-axis direction (positional shift with respect to the index mark within the alignment system 24a) is measured with the alignment control unit 60 via the alignment system 24a, and the measurement results are sent to the main controller 90. The main controller 90 then obtains the coordinate values of the fiducial marks Ma1, Mb2, Mc, and Md in the alignment coordinate system, based on the positional shift amount of each fiducial mark and the positional information on the wafer stage WST1 (measurement values of the interferometers 44 and 16) at the time of each measurement, and stores the results in the memory unit.

(3) The main controller 90 then calculates the X coordinates and the Y coordinates of each alignment mark on the alignment coordinate system. This calculation is made from the measurement of the positional shift amount of each alignment mark respectively arranged in at least three shot areas on the wafer W1 (to be more precise, at least three shot areas which are located within the squarish shaped area EA in FIG. 4, referred to earlier) in the X direction and Y direction as well as from the coordinates of the wafer stage WST1 (measured with the interferometers 16 and 44) at the time of each measurement, in the same way the coordinate values of the fiducial marks Ma1, Mb2, Mc, and Md referred to above were obtained.

(4) Next, the main controller 90 calculates the center coordinates and the rotational angle θ1 of the wafer holder H1 by the least squares method from the coordinates of the fiducial marks Ma1, Mb2, Mc, and Md in the vicinity of the wafer holder H1, which has been measured as above. Then, the main controller 90 sets the coordinate system of the wafer holder H1 (hereinafter referred to as the "holder coordinate system"), which is an XY orthogonal coordinate system rotated by the angle of θ1 with the center coordinates of the wafer holder H1 as the origin.

(5) After setting the holder coordinate system, the main controller 90 converts the coordinates (actual measurement values) of the alignment marks on the wafer W1 based on the alignment coordinate system into the coordinates based on the holder coordinate system. And, by using the converted coordinates, the main controller 90 sets the arrangement coordinates of the $i^{th}$ shot area ($X_i$, $Y_i$) on the wafer W1 using the model equation of statistic processing based on the Enhanced Global Alignment (EGA) method, as is disclosed, for example, in the Japanese Patent Laid Open No. 61-44429 and the corresponding U.S. Pat. No. 4,780,617. The disclosure of the U.S. Patent cited above is fully incorporated herein by reference.

In this case, alignment marks of shot areas belonging within the squarish area EA set by the fiducial marks Ma1, Mb2, Mc, and Md used to set the holder coordinate system are selected and measured. Therefore, even if the position coordinates of these alignment marks are converted to coordinates based on the holder coordinate system, they can be treated with high reliability. Accordingly, the arrangement coordinates ($X_i$, $Y_i$) set from these coordinate values are also highly reliable. That is, it can be considered that the level of errors of the arrangement coordinates is around the same as the measurement error of the fiducial marks Ma1, Mb2, Mc, and Md.

The arrangement coordinates $(X_i, Y_i)$ are relative positional information on each shot area on the wafer W1 with respect to the wafer holder H1, and the arrangement coordinates $(X_i, Y_i)$ are stored in the memory unit within the main controller 90. Also, since this embodiment is based on a premise that the wafer holder H1 has a residual rotational error with respect to the X-axis and the Y-axis, the coordinate system of the wafer holder H1 is to rotate with respect to the X-axis and the Y-axis.

In addition, since the alignment system 24a uses a broadband alignment light of a non-exposure wavelength, the fiducial marks Ma1, Mb2, Mc, and Md and the alignment marks are both measured with high precision. Further, in order to smoothly measure the center and the rotation angle of the wafer holder H1, it requires only the two-dimensional measurement of at least one fiducial mark and an X-axis mark or a Y-axis mark measurement of another fiducial mark. However, the more the fiducial marks are measured, the measurement can be more accurate since the averaging effect can be gained and it also becomes possible to consider the scaling (expansion and contraction) of the wafer holder H1. Likewise, with the alignment marks, the minimum requirement for measurement is to measure the one-dimensional position of three alignment marks. However, in order to take the scaling (in the X direction and Y direction) and the orthogonal degree error into account, the number of the shot areas to be measured should preferably be, for example, three or over, and the number of alignment marks to be measured should preferably be six or over when converted to a one-dimensional alignment mark.

The alignment operations described above on the wafer W1 on the wafer stage WST1 are completed prior to the exposure operations on the wafer W2 on the wafer stage WST2 side, and the wafer stage WST1 then moves into a waiting state.

(6) And, when the exposure operations on the wafer W2 is completed, the main controller 90 moves the wafer stage WST1 so that it is positioned below the projection optical system PL as is shown in FIG. 1, for exposure on the wafer W1. However, as it can be easily imagined from FIG. 2 and FIG. 3, the position of the wafer stage WST1 in the Y-axis direction cannot be measured since while the wafer stage WST1 is being moved the interferometer beam referred to as the length measuring axis BI1Y strays off the movable mirror 96b. Therefore, the main controller 90 moves the wafer stage WST1 below the projection optical system PL with the following devisal. That is, the main controller 90 temporarily moves the wafer stage WST1 via the stage control unit 70, the X-axis linear motors 82 and 83, and the Y-axis linear motor 80, so that either one of the fiducial marks Ma1, Mb2, Mc, or Md, for example, Ma1, is positioned within the field of the alignment system 24a. The main controller 90 then servo controls the Y-axis linear motor 80 with the Y position at that time as the target value via the stage control unit 70, so that the wafer stage WST1 moves into a stationary state regarding the Y-axis direction. And, at the same time, the main controller 90 drives the X-linear motors 82 and 83 via the stage control unit 70 so that the wafer stage WST1 moves in the +X direction at a distance corresponding to the distance between the detection center SXa and the optical axis AX obtained in advance, while monitoring the measurement values of the interferometer 16 which has the length measuring axis BI1X. With this operation, the wafer stage WST1 is moved in the +X direction, and by this movement the fiducial mark plate Ma1 that had been located directly under the alignment system 24a is located directly under the projection optical system PL. As a matter of course, in parallel with moving the wafer stage WST1, the main controller 90 moves the wafer stage WST2 in the same manner as of the wafer stage WST1 referred to above via the stage control unit 70, so that the wafer stage WST2 is positioned below the alignment system 24b at the wafer exchange position, and resets the interferometer 48 which has the length measuring axis BI3Y just before any of the fiducial marks on the wafer stage WST2 become detectable with the alignment system 24b.

(7) Then, as is shown in FIG. 1, the main controller 90 moves the respective mirrors 31 and 32 so that they are located respectively above the reticle marks RM1 and RM2. The alignment lights having the exposure wavelength are respectively irradiated onto the reticle marks RM1 and RM2 from the RA microscopes 41 and 42, and the alignment lights that have passed through the periphery of the reticle marks RM1 and RM2 are respectively irradiated onto the fiducial marks Ma1 and Ma2 via the projection optical system PL. With this operation, the alignment control unit 60 detects the positional relationship of the image of the fiducial mark Ma1 and Ma2 and the corresponding reticle mark RM1 and RM2, and the detection results are sent to the main controller 90. In this case, prior to the detection of the positional relationship above, the interferometer 46 is reset at some point where the interferometer beam shown as length measuring axis BI2Y is picked up by the reflection surface of the movable mirror 96b, and after that point, the position of the wafer stage WST1 is controlled based on the XY coordinate system which origin is the optical axis of the projection optical system PL set by the length measuring axes BI2Y and BI1X (hereinafter referred to as the "exposure coordinate system").

(8) Accordingly, the main controller 90 obtains the positional relationship between the exposure position (the projection center of the projection optical system PL) and the coordinate position of the fiducial marks Ma1 and Ma2 on the fiducial mark plate FMa, that is, the positional shift amount. This is obtained by calculating the coordinate position of the fiducial marks Ma1 and Ma2 on the fiducial mark plate FMa based on the exposure coordinate system and by calculating the coordinate position of the projection image of the mark RM1 and RM2 of the reticle R on the wafer surface and then obtaining the difference, based on the detection results described above of the alignment control unit 60 and the measurement values of the interferometers 46 and 16 that respectively have the length measuring axes BI2Y and BI1X at the time of detection.

In this case, the exposure center is the center of the images of the reticle marks RM1 and RM2, and the tilt angle of a straight line passing through the center of the images with respect to the X-axis is the tilt angle of the reticle pattern image. In this embodiment, the rotational angle of the reticle stage RST is to be corrected beforehand, so that the tilt angle is almost zero.

In addition to measuring the positional relationship between the exposure position (the projection center of the projection optical system PL) and the coordinate position of the fiducial marks Ma1 and Ma2 on the fiducial mark plate FMa, the main controller 90 may perform scaling adjustment of the interferometers of the reticle stage RST and the wafer stage WST1, that is, scanning movement distance adjustment between the reticle R and the wafer W1 on relative scanning operations, by relatively moving the fiducial marks Mb1 to Mb3 on the fiducial mark plate FMb and the reticle marks formed on the reticle and measuring them using one of the reticle alignment microscopes 41 (or 42).

(9) And then, the main controller 90 calculates the offset of the holder coordinate system referred to earlier in the X-axis direction and Y-axis direction with respect to the exposure coordinate system and the rotational angle θ2, by using the X coordinates and Y coordinates of the fiducial marks Ma1 and Ma2. The main controller 90 then uses the information on the offset and the rotational angle θ2 and the arrangement coordinates $(X_i, Y_i)$ of each shot area on the wafer W1 based on the holder coordinate system stored in memory in the earlier process to calculate the arrangement coordinates $(XA_i, YA_i)$ of each shot area on the wafer W1 based on the exposure coordinate system. When the arrangement coordinates $(XA_i, YA_i)$ are used, the center of each shot area on the wafer W1 and the center of the pattern image of the reticle R can be made to match with high precision. Then, the main controller 90 withdraws the mirrors 31 and 32 from the optical path of the exposure light IL, and after this is competed, then on the wafer stage WST1 exposure on the wafer W1 is performed in the manner similar to the exposure on wafer W2, previously described.

Instead of calculating only the offset, as is described above, or calculating the rotational angle in addition, the arrangement coordinates of each shot area based on the exposure coordinate system may be calculated by detecting at least three fiducial marks using either one of the RA microscopes 41 or 42, obtaining the X coordinates and Y coordinates of the wafer stage (fiducial marks) based on the coordinate system (exposure coordinate system) when the positional shift amount of each fiducial marks with respect to the reticle marks is zero or a predetermined value, and then, for example, applying the EGA method previously described. That is, the coordinate values based on the exposure coordinate system and the coordinate values based on the holder coordinate system of each fiducial mark may be substituted in the model equation of the EGA method, and the error parameter may be calculated by the least squares method or the like. And by substituting the arrangement coordinates of each shot area based on the holder coordinate system in the model equation calculating the error parameter, the arrangement coordinates of each shot area based on the exposure coordinate system maybe calculated.

As can be seen so far, since the arrangement coordinates $(X_i, Y_i)$ of each shot area on the wafer W1 based on the holder coordinate system are highly reliable, consequently, each shot area on the wafer W1 can be overlaid with high precision with respect to the pattern image of the reticle R. That is, a high alignment precision (overlay accuracy) can be obtained with the exposure apparatus related to this embodiment.

Meanwhile, on the wafer stage WST2, in parallel with the exposure performed on the wafer W on the wafer stage WST1 side, the wafer exchange unit (not shown in Figs.) performs wafer exchange at the wafer exchange position below the alignment system 24b. And after the wafer is exchanged, alignment operations are performed on the exchanged wafer (referred to as "wafer W'" for the sake of convenience) in a procedure similar to the one previously described.

And, when exposure operations on the wafer W1 has been completed, the wafer stage WST1 then moves to the position shown in FIG. 2 (below the alignment system 24b), and wafer exchange by the wafer exchange unit and alignment operations described earlier are performed, whereas, the wafer stage WST2 moves to the position below the projection optical system PL and exposure is performed on the wafer W'. In this manner, in the embodiment, in parallel with exposure operations on the wafer on one of the wafer stages WST1 (or WST2), wafer exchange and alignment operations are performed on the other stage WST2 (or WST1). Therefore, as a consequence, high throughput can be achieved.

As is described in detail so far, with the exposure apparatus 10 related to the embodiment, on the wafer stage WST1 (or WST2), four fiducial mark plates FMa to FMd (or FMa' to FMd') on which a plurality of fiducial marks Ma1 to Md (or Ma1' to Md') used in each measurement sequence are formed dispersedly are arranged in the periphery of the wafer holder, in a positional relationship constant between the plurality of fiducial marks and the wafer holder H1 (or H2). In addition, the main controller 90 executes various measurement sequences including detection operations to detect the positional information of each fiducial mark using the alignment system 24a (or 24b), therefore, performance related to measurement can be maintained. Furthermore, since the plurality of fiducial marks used in each measurement sequence are formed dispersedly on the fiducial mark plates FMa to FMd, the reference mark plates can be arranged in a small space on the wafer stage (refer to FIG. 4). Accordingly, it becomes possible to downsize the wafer stage, which leads to reducing the footprint of the apparatus.

In addition, the fiducial marks Ma1 to Md (or Ma1' to Md') are arranged so that they are located in the vicinity of each corner of the squarish shape that contains the center of the wafer holder H1 (or H2). This arrangement allows sufficient space (distance) between the fiducial marks, and the limits of the measurement span can also be relaxed, which leads to an improvement in measurement accuracy. And since the center of the wafer holder H1 (or H2) is located within the squarish area enclosed with the fiducial marks, in the case of obtaining the center of the wafer holder based on the measurement results of the fiducial mark positions, the center point corresponds, so to speak, to the interpolation point of the fiducial mark positions. Accordingly, the main controller 90 can obtain the holder coordinate system which origin is the center of the wafer holder with a sufficient level of reliability, by using the alignment systems and the interferometers to detect the position information on each fiducial mark arranged on the wafer stage and performing a predetermined calculation based on the positional information. Also, the main controller 90 obtains the positional information on the alignment marks located within the squarish shape in the alignment coordinate system with the use of the alignment systems and the interferometers and converts them into positional information based on the holder coordinate system. This allows the main controller 90, for example, in the case when the wafer stage position cannot be measured with the interferometers and the position of the wafer stage cannot be controlled temporarily, to re-measure the fiducial marks based on a new coordinate system (exposure coordinate system) and based on the measurement results and the positional information based on the holder coordinate system, to obtain the positional information on the alignment marks with high reliability based on the new coordinate system. Accordingly, the position of the wafer can be controlled with good accuracy at all times, without increasing the size of the wafer stage or the footprint of the apparatus.

Furthermore, the position of the wafer stages WST1 and WST2 is controlled based on the orthogonal coordinate system such as the alignment coordinate system and the exposure coordinate system by the interferometers, and the plurality of fiducial mark plates include a first mark plate (FMa, FMa') on which a plurality of fiducial marks are formed in the X-axis direction of the orthogonal coordinate system and narrowly extends in the X-axis direction and a second mark plate (FMb, FMb') on which a plurality of fiducial marks are arranged in the Y-axis direction and narrowly extends in the Y-axis direction. Thus, by dispersing the multiple fiducial marks depending on their usage circumstances, the size of each fiducial mark plate can be reduced while maintaining their performance, which as a consequence, makes downsizing of the wafer stage on which the fiducial mark plate are arranged possible.

In the embodiment above, the case has been described where each fiducial mark is formed on the fiducial mark plates (FMa–FMd and FMa'–FMd') arranged in the periphery of the wafer holders (wafer holding members). This arrangement was made so as to easily secure the precision (such as the line width and the level of flatness) upon processing, however, the present invention is not limited to this, and the fiducial marks may be formed directly on the wafer stage, or on the wafer holder. In addition, a fiducial mark plate separate from the wafer holder may be fixed on the wafer stage.

In addition, in the embodiment above, the holder coordinate system was set from coordinate values (measurement values) obtained by detecting a plurality of fiducial marks, however, the holder coordinate system may be set, for example, from the calculation values obtained by calculating the coordinate values of each fiducial mark based on the EGA method using the coordinate values of the plurality of fiducial marks referred to above. Or, the holder coordinate system may be set, from the parameters obtained at the point when the error parameter of the model equation used to calculate the coordinate values based on the EGA method is calculated, such as from the offset and the rotational error. Also, the coordinate values of the fiducial mark and each shot area may be calculated based on the EGA method using the coordinate values obtained by detecting at least one fiducial mark with the alignment systems 24$a$ and 24$b$ of the off-axis method and the coordinate values obtained by respectively detecting the alignment marks in at least three shot areas, and based on the deviation of the coordinate values obtained by detecting at least one fiducial mark with RA microscopes 41 and 42 and the coordinate values calculated earlier, the coordinate values of each shot area calculated earlier may be corrected and the arrangement coordinates ($X_i$, $Y_i$) previously described set.

In the embodiment above, when the wafer stage WST1 is moved from below the alignment system 24$a$ (the state shown in FIG. 2) to the position below the projection optical system PL (the state shown in FIG. 1) (or when the wafer stage WST2 is moved from below the alignment system 24$b$ (the state shown in FIG. 1) to the position below the projection optical system PL (the state shown in FIG. 2), it is preferable that the positional relationship between the wafer holder and the wafer, and also the fiducial mark plate and the wafer does not change. Therefore, on the portion of the wafer stage WST1 (or WST2) where the wafer holder and the fiducial mark plates are to be mounted, a heating and cooling element such as a heater of a Peltier element, and a temperature control unit made up of a temperature measurement element such as a thermistor may be arranged so that the temperature control unit maintains the temperature of the wafer holder, wafer, and fiducial mark plates at a constant level.

Also, in order to disperse the fiducial marks depending on the measurement sequences, it is, as a matter of course, possible to use a dispersion method different from the method introduced in the embodiment above.

Figure 5:
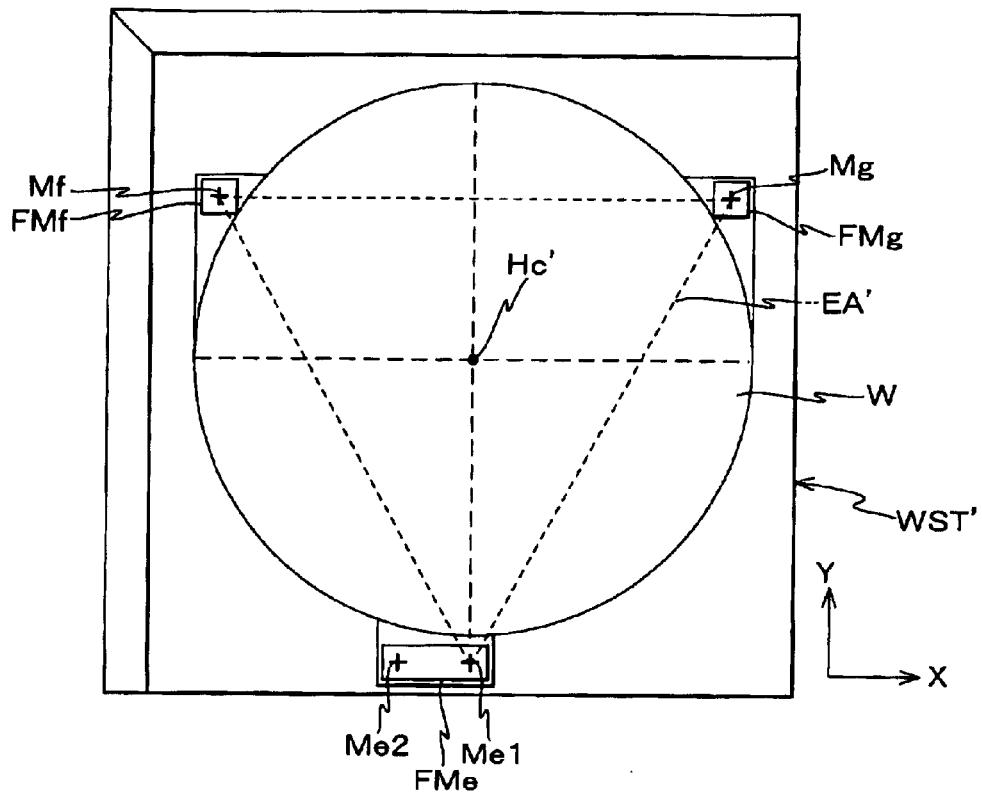
FIG. 5 is a planar view showing the wafer stage related to the first modified example.
Figure 6:
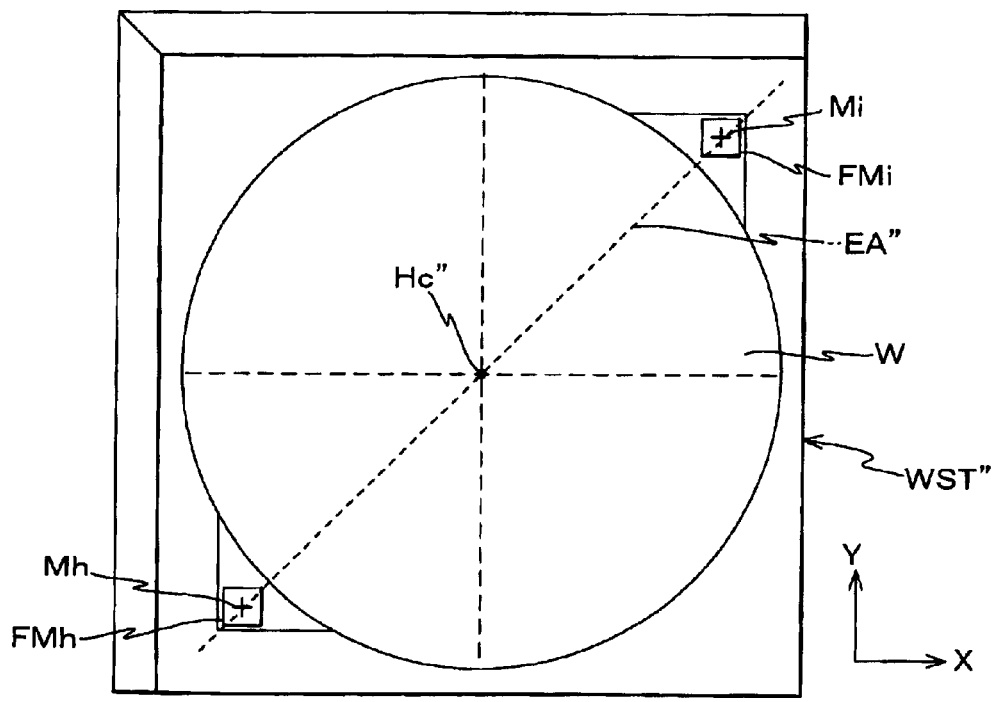
FIG. 6 is a planar view showing the wafer stage related to the second modified example.

Furthermore, in the embodiment above, four fiducial mark plates were arranged in the periphery of the wafer holder, however, the present invention is not limited to this, and the arrangement shown in FIG. 5 and FIG. 6 can be employed. Following is a description of a modified example of the arrangement of the fiducial marks, with reference to FIG. 5 and FIG. 6.

FIG. 5 shows a wafer stage WST' related to the first modified example. As it can be seen from FIG. 5, there are three fiducial mark plates FMe, FMf, and FMg on the periphery of the wafer holder on the wafer stage WST'. These three fiducial mark plates FMe, FMf, and FMg are arranged almost at the vertex of the triangle EA' which contains the center of the wafer holder Hc' within. Of these fiducial mark plates, on the fiducial mark plate FMe, which is arranged on the lower side (–Y side) of the wafer W in FIG. 5, two fiducial marks Me1 and Me2 that can be measured at the same time with a pair of RA microscopes that make up a twin lens, as is with the fiducial mark plate FMa shown in FIG. 4, and on the other fiducial mark plates FMf and Fmg, fiducial marks Mf and Mg to set the holder coordinate system are respectively formed, as is with the fiducial mark plates FMc and Fmd shown in FIG. 3.

In the case of the modified example shown in FIG. 5, similar to the embodiment above, since the center of the wafer holder is located within the triangular area EA' enclosed with the fiducial marks, in the case of obtaining the center of the wafer holder based on the measurement results of the fiducial mark positions, the center point corresponds, so to speak, to the interpolation point of the fiducial mark positions. Accordingly, the main controller 90 can obtain the holder coordinate system which origin is the center of the wafer holder with a sufficient level of reliability, by using the alignment systems and the interferometers to detect the position information on each fiducial mark arranged on the wafer stage and performing a predetermined calculation based on the positional information. In addition, by performing EGA calculation using the positional information on the alignment marks provided along the shot area located within the area EA', the reliability of the error parameters (X and Y offset, rotation, orthogonal degree, X and Y scaling) which are the calculation results can be higher than the case when EGA calculation is performed using the positional information on the alignment marks provided along the shot area located outside the area EA'. This point is likewise, with the embodiment above.

Furthermore, in an arrangement where the space between the fiducial mark plates is large only in a predetermined direction, the measurement accuracy in the so-called EGA measurement decreases since the space in the direction perpendicular to the predetermined direction becomes small. Therefore, it is preferable to arrange the fiducial marks (fiducial mark plates) on the periphery of the wafer holder at an angular interval almost equal.

The arrangement of the fiducial mark plates on the wafer stage is not limited to modified example or the embodiment above, and the fiducial mark plates need only to be arranged with at least three fiducial marks positioned at the vertex of a polygon. The number and the arrangement position of the fiducial mark plates can be set arbitrarily.

FIG. 6 shows a wafer stage WST" related to the second modified example. As it can be seen from FIG. 6, the wafer stage WST" related to the second modified example has its features on the point that two fiducial mark plates, FMh and FMi, are arranged in the vicinity of the wafer holder.

These two fiducial mark plates FMh and FMi are arranged on opposite sides with respect to the center of the straight line EA" which passes through the center of the wafer holder. And, on the fiducial mark plates FMh and FMi, fiducial marks Mh and Mi to set the holder coordinate system are formed, as is with the fiducial mark plates FMc and Fmd shown in FIG. 3.

With this arrangement of the two fiducial mark plates, the space between the fiducial marks can be as long as the diameter of the wafer holder and the limits of the measurement span can be relaxed, which leads to an improvement in measurement accuracy. And since the center of the wafer holder is located on the straight line that links the two fiducial marks, in the case of obtaining the center of the wafer holder based on the measurement results of the fiducial mark positions, the center point corresponds, so to speak, to the interpolation point of the fiducial mark positions. Accordingly, the main controller 90 can, for example, obtain the holder coordinate system which origin is the center of the wafer holder with a sufficient level of reliability, by using the alignment systems and the interferometers to detect the positional information on each fiducial mark arranged on the wafer stage and performing a predetermined calculation based on the positional information. Also, the main controller 90 obtains the positional information on the alignment marks located on the straight line on the wafer, for example, on the alignment coordinate system, with the use of the alignment systems and the interferometers, and converts them into positional information based on the holder coordinate system. This allows the main controller 90, for example, in the case when the position of the wafer stage cannot be controlled temporarily, to re-measure the fiducial marks based on a new coordinate system (exposure coordinate system), and based on the measurement results and the positional information based on the holder coordinate system, to obtain the positional information on the alignment marks with high reliability based on the new coordinate system. Accordingly, the position of the wafer can be controlled with good accuracy at all times, without increasing the size of the wafer stage or the footprint of the apparatus. In this case, since the two fiducial marks are symmetrical to the center of the wafer holder, for example, the center coordinates and the rotational angle of the wafer holder can be easily calculated. Also, for example, when the position of the wafer stage is controlled with the interferometers based on the orthogonal coordinate system, by making the straight line linking the two fiducial marks tilt at an angle of around 45°, with respect to the coordinate axes of the orthogonal coordinate system, it becomes possible to measure the mark position in both coordinate axis directions of the orthogonal coordinate system with a similar level of accuracy. In addition, the exposure apparatus shown in FIG. 1 had two wafer stages, however, it may also be a single stage, and the arrangement other than the fiducial mark plates may be arbitrary. Furthermore, the fiducial marks formed on each fiducial mark plate may either be one-dimensional or two-dimensional, or a combination of both.

Furthermore, in the embodiment described earlier, the surface of the fiducial mark plates was set at around the same height as of the wafer surface. The fiducial mark plates, however, do not necessarily have to be arranged so that the surface is at the same height as of the wafer surface. In addition, in the embodiment above, two alignment systems 24a and 24b were arranged on both sides of the projection optical system, and the wafer stage WST1 was to move between the alignment system 24a and the projection optical system PL and the wafer stage WST2 was to move between the alignment system 24b and the projection optical system PL. As is disclosed, however, in WO No. 98/40791, an arrangement with only one of the alignment systems 24a or 24b may be possible, and the two wafer stages can be switched alternately between the alignment system and the projection optical system PL. Moreover, in parallel with the exposure on the wafer at either the wafer stage WST1 or WST2, when the marks on the wafer are detected with the alignment system 24a and 24b on the other wafer stage, for example, step information on the shot areas on the wafer may be detected using a sensor having a similar arrangement with the AF sensor used in the projection optical system PL.

In the embodiment above, ultraviolet light such as the KrF excimer laser or the ArF excimer laser, or a pulse laser in the vacuum ultraviolet region such as the $F_2$ laser was used as the light source, however, the present invention is not limited to this, and other vacuum ultraviolet light such as the $Ar_2$ laser (output wavelength: 126 mm) may be used. In addition, for example, as the vacuum ultraviolet light, besides the laser beam emitted from each light source referred to above, a harmonics generated by amplifying a single wavelength laser beam in the infrared or visible region oscillated from a DFB semiconductor laser or a fiber laser with an erbium (Er) (or both erbium and ytteribium (Yb))-doped fiber amplifier and converting the wavelength to an ultraviolet light with a non-linear optical crystal may be used.

In the embodiment above, the case has been described where the scanning exposure apparatus based on the step-and-scan method or the like was applied to the present invention. As a matter of course, however, the application scope of the present invention is not limited to this. That is, the present invention can be suitably applied to a reduction projection exposure apparatus based on the step-and-repeat method.

The exposure apparatus in the embodiment above can be made by incorporating the illumination optical system made up of a plurality of lenses and the projection optical system into the main body of the exposure apparatus and performing optical adjustment, while incorporating the reticle stage RST made up of various mechanical components and the wafer stage into the main body of the exposure apparatus, connecting the wiring and piping, and furthermore, performing total adjustment (electrical adjustment, operational adjustment) The exposure apparatus is preferably made in a clean room in which temperature, degree of cleanliness, and the like are controlled.

The present invention is not limited to the exposure apparatus for semiconductors, but can also be applied to the exposure apparatus that transfers a device pattern onto a glass plate used to manufacture displays including the liquid crystal display devices or the like, the exposure apparatus that transfers a device pattern onto a ceramic wafer used to manufacture thin-film magnetic heads, and the exposure apparatus used to manufacture pick-up devices (such as the CCD), micromachines, DNA chips, or the like. In addition, the present invention can be applied to the exposure apparatus that transfers the circuit pattern onto a glass substrate or a silicon wafer to manufacture reticles or masks used in not only the exposure apparatus for microdevices such as the semiconductors, but also in the exposure apparatus such as the optical exposure apparatus, the EUV exposure apparatus, the X-ray exposure apparatus, and the electron beam exposure apparatus. With the exposure apparatus that uses the DUV (Deep UltraViolet) light or VUV (Vacuum UltraViolet) light or the like, the transmission type reticle is normally used, and as the reticle substrate material such as silica glass, fluorine doped silica glass, fluorite, magnesium fluoride, or crystal is used. Furthermore, proximity X-ray exposure apparatus, the electron beam exposure apparatus, and the like use the transmission type mask (stencil mask, membrane mask), and as the mask substrate, silicon wafers or the like are used.

While the above-described embodiment and the modified examples of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A stage unit comprising:
   a first stage which moves two dimensionally with a substrate holding member holding a substrate mounted, and a second stage which is provided separately from said first stage;
   at least a first fiducial mark and a second fiducial mark provided on each of said first stage and said second stage for use in a predetermined measurement sequence, said first fiducial mark and said second fiducial mark both used in said predetermined measurement sequence; and
   first and second fiducial mark plates, wherein said first fiducial mark is provided on said first fiducial mark plate on both of said first and said second stages, and said second fiducial mark is provided on said second fiducial mark plate on both of said first and said second stages, a position of said second fiducial mark plate being different from a position of said first fiducial mark plate on the respective stages.

2. The stage unit according to claim 1, comprising at least a third fiducial mark, wherein said at least first, second, and third fiducial marks are respectively arranged in the vicinity of each vertex position of a polygon which contains a center of said substrate holding member.

3. The stage unit according to claim 1, wherein said first and second fiducial marks are arranged on a straight line passing through a center of said substrate holding member on opposite sides with respect to said center.

4. An exposure apparatus which exposes a substrate with an energy beam and forms a predetermined pattern on said substrate, said exposure apparatus comprising:
   a first stage which moves two-dimensionally with a substrate holding member holding said substrate mounted, and a second stage which is provided separately from said first stage;
   a first fiducial mark and a second fiducial mark which are arranged on each of said first stage and said second stage, and are both used in a predetermined measurement sequence;
   a mark detection system which detects marks located on at least one of said first and second stages;
   a control unit which performs said predetermined measurement sequence including detection of said first and second fiducial marks using said mark detection system; and
   first and second fiducial mark plates, wherein said first fiducial mark and said second fiducial mark are both used in said predetermined measurement sequence, said first fiducial mark is arranged on said first fiducial mark plate on both of said first and said second stages, and said second fiducial mark is arranged on said second fiducial mark plate on both of said first and said second stages, a position of said second fiducial mark plate being different from a position of said first fiducial mark plate on the respective stages.

5. The exposure apparatus according to claim 4, wherein said mark detection system includes:
   a first detection unit which detects said first and second fiducial marks on said first stage; and
   a second detection unit which detects said first and second fiducial marks on said second stage.

6. The exposure apparatus according to claim 5, wherein said predetermined measurement sequence includes setting a coordinate system which origin is a center coordinate of said substrate holding member.

7. An exposure apparatus which exposes a substrate with an energy beam and forms a predetermined pattern on said substrate, said exposure apparatus comprising:
   a substrate stage that moves two-dimensionally;
   a position measurement unit that measures a position of said substrate stage;
   a substrate holding member mounted on said substrate stage that holds said substrate;
   at least three fiducial marks that are respectively arranged in the vicinity of each vertex position of a polygon that contains a center of said substrate holding member, and are arranged on said substrate stage with a positional relationship between each of said fiducial marks and said substrate holding member constant;
   a mark detection system which detects marks located on said substrate stage including said fiducial marks; and
   a control unit that performs various types of measurement sequences respectively including a detection operation to detect either of one and a plurality of said at least three fiducial marks using said mark detection system and said position measurement unit.

8. The exposure apparatus according to claim 7, said exposure apparatus further comprising:
   a plurality of fiducial mark plates on which at least one of said fiducial marks is respectively formed, said fiducial mark plates arranged on a periphery of said substrate holding member on said substrate stage.

9. The exposure apparatus according to claim 8, wherein said at least three fiducial marks are arranged on said plurality of fiducial mark plates, dispersed by each measurement sequence which uses at least one of said fiducial marks.

10. The exposure apparatus according to claim 9, wherein
   a position of said substrate stage is controlled with said position measurement unit based on an orthogonal coordinate system, and
   said plurality of fiducial mark plates include
     a first mark plate on which a plurality of fiducial marks are arranged along a first axis direction of said orthogonal axis, said first mark plate narrowly extending in said first axis direction, and
     a second mark plate on which a plurality of fiducial marks are arranged along a second axis direction orthogonal to said first axis, said second mark plate narrowly extending in said second axis direction.

11. The exposure apparatus according to claim 7, wherein said at least three fiducial marks are respectively formed on said substrate holding member.

* * * * *

UNITED STATES PATENT AND TRADEMARK OFFICE
CERTIFICATE OF CORRECTION

PATENT NO.   : 6,788,393 B2
DATED        : September 7, 2004
INVENTOR(S)  : Jiro Inoue It is certified that error appears in the above-identified patent and that said Letters Patent is hereby corrected as shown below:

Column 29,
Line 30, between "mark" and "and", insert -- provided on each of said first stage and said second stage --; and
Lines 32 and 33, delete "for use in a predetermined measurement sequence"; and
Line 34, delete "said" and substitute with -- a --; and
Line 38, delete "said" before "second"; and
Line 60, between "mark" and "and", please insert -- arranged on each of said first stage and said second stage --; and
Line 60, delete "which are"; and
Line 62, delete "and are" and substitute with -- said first fiducial mark and said second fiducial mark --; and Column 30,
Line 5, after "and", delete "said"; and
Line 7, after "and", delete "said".

Signed and Sealed this

Fifteenth Day of February, 2005

JON W. DUDAS
*Director of the United States Patent and Trademark Office*